(12) United States Patent
Tang et al.

(10) Patent No.: US 11,450,628 B2
(45) Date of Patent: Sep. 20, 2022

(54) PACKAGE STRUCTURE INCLUDING A SOLENOID INDUCTOR LATERALLY ASIDE A DIE AND METHOD OF FABRICATING THE SAME

(71) Applicant: Taiwan Semiconductor Manufacturing Co., Ltd., Hsinchu (TW)

(72) Inventors: Tzu-Chun Tang, Kaohsiung (TW); Chung-Hao Tsai, Changhua County (TW); Chen-Hua Yu, Hsinchu (TW); Chuei-Tang Wang, Taichung (TW); Chia-Chia Lin, Kaohsiung (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/846,416

(22) Filed: Apr. 13, 2020

(65) Prior Publication Data

US 2021/0183794 A1 Jun. 17, 2021

Related U.S. Application Data

(60) Provisional application No. 62/948,305, filed on Dec. 15, 2019.

(51) Int. Cl.
*H01L 23/64* (2006.01)
*H01L 23/31* (2006.01)
(Continued)

(52) U.S. Cl.
CPC ............ *H01L 23/645* (2013.01); *H01L 21/56* (2013.01); *H01L 23/3114* (2013.01);
(Continued)

(58) Field of Classification Search
CPC . H01L 23/645; H01L 23/481; H01L 23/3114; H01L 23/5384; H01L 21/56; H01L 21/565; H01L 2224/18; H01L 2224/023; H01L 2224/02373; H01L 2224/02375; H01L 2224/024;
(Continued)

(56) References Cited

U.S. PATENT DOCUMENTS 8,339,233 B2 * 12/2012 Tsai .................... H01F 17/0013
336/200
8,918,189 B2 * 12/2014 Dabney .................. H01F 17/00
607/116

(Continued)

Primary Examiner — Khiem D Nguyen
(74) Attorney, Agent, or Firm — JCIPRNET

(57) ABSTRACT

Provided is a package structure including a first die; a plurality of through vias, aside the first die; a first encapsulant laterally encapsulating the first die and the plurality of through vias; a first redistribution layer (RDL) structure on first sides of the first die, plurality of through vias, and the first encapsulant; a second RDL structure on second sides of the first die, the plurality of through vias, and the first encapsulant; and a plurality of conductive connectors, electrically connected to the second RDL structure. Portions of the first RDL structure, the plurality of through vias, and the second RDL structure are electrically connected to each other and form a solenoid inductor laterally aside the first die.

20 Claims, 23 Drawing Sheets

(51) Int. Cl.
 *H01L 49/02* (2006.01)
 *H01L 23/48* (2006.01)
 *H01L 21/56* (2006.01)

(52) U.S. Cl.
 CPC ........ *H01L 23/3121* (2013.01); *H01L 23/481* (2013.01); *H01L 28/10* (2013.01)

(58) Field of Classification Search
 CPC ..... H01L 2924/181; H01L 2924/00012; H01L 23/3121
 USPC ........................................................ 257/531
 See application file for complete search history.

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,921,640 B2 * | 3/2018 | Zillmann | H01L 21/76898 |
| 10,049,815 B2 * | 8/2018 | Kim | H01F 41/041 |
| 10,431,511 B2 * | 10/2019 | Kim | H01L 23/645 |
| 10,790,235 B2 * | 9/2020 | Chiu | H01L 21/565 |
| 2014/0035892 A1 * | 2/2014 | Shenoy | H01L 23/15 345/205 |
| 2014/0111273 A1 * | 4/2014 | Jou | H01L 24/18 327/564 |
| 2014/0240071 A1 * | 8/2014 | Aiderton | H01F 17/0013 336/200 |
| 2016/0358897 A1 * | 12/2016 | Albers | H01L 23/552 |
| 2017/0062398 A1 * | 3/2017 | Arabi | H01L 24/13 |
| 2017/0086295 A1 * | 3/2017 | Erturk | H01L 23/5227 |
| 2017/0338034 A1 * | 11/2017 | Yun | H01F 17/00 |
| 2018/0025999 A1 * | 1/2018 | Yu | H01L 23/485 257/428 |
| 2018/0138126 A1 * | 5/2018 | Chen | H01L 21/76877 |
| 2018/0337136 A1 * | 11/2018 | Han | H03H 9/703 |
| 2019/0348356 A1 * | 11/2019 | Hsieh | H01L 23/49822 |
| 2019/0385791 A1 * | 12/2019 | Leipold | H01F 41/042 |
| 2020/0066830 A1 * | 2/2020 | Bharath | H01L 23/5227 |
| 2020/0312766 A1 * | 10/2020 | Bhagavat | H01L 25/50 |

\* cited by examiner

PACKAGE STRUCTURE INCLUDING A SOLENOID INDUCTOR LATERALLY ASIDE A DIE AND METHOD OF FABRICATING THE SAME

CROSS-REFERENCE TO RELATED APPLICATION

This application claims the priority benefit of U.S. provisional application Ser. No. 62/948,305, filed on Dec. 15, 2019. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (PoP) devices and so on. The formation of the redistribution circuit structure also plays an important role during packaging process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
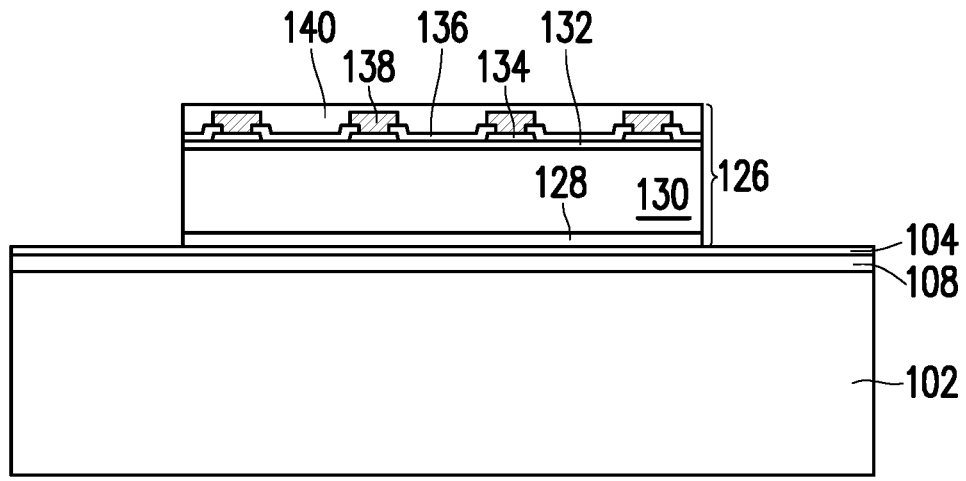
FIGS. 1A through 1G are schematic cross-sectional views illustrating a method of manufacturing a device package having a 3-dimensional (3D) solenoid inductor according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 2A:
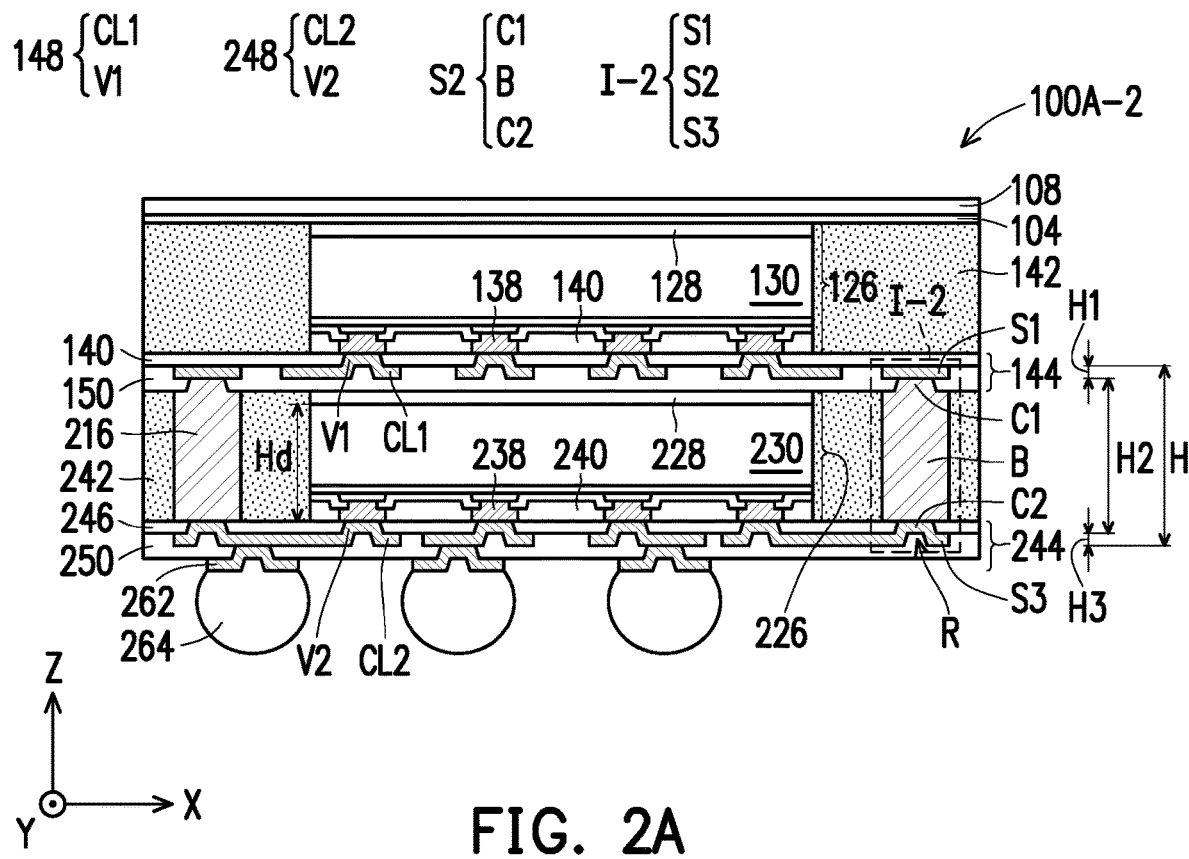
FIG. 2A is a schematic cross-sectional view illustrating a device package having a 3D solenoid inductor according to some embodiments of the disclosure.
Figure 3A:
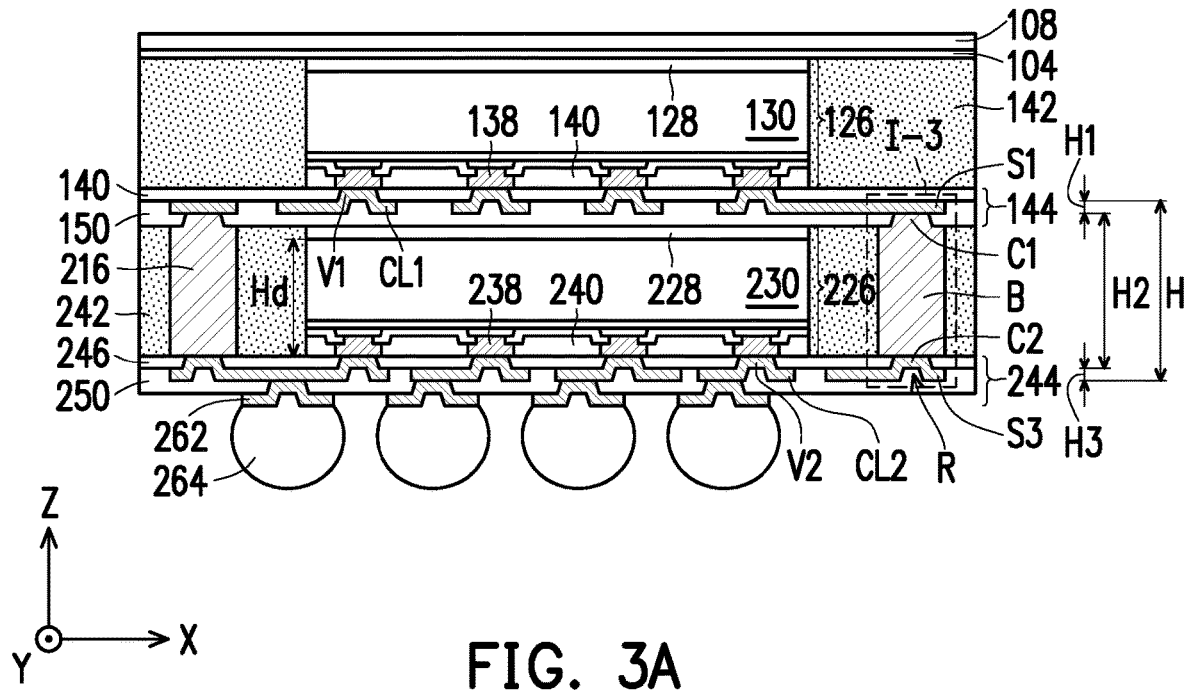
FIG. 3A is a schematic cross-sectional view illustrating a device package having a 3D solenoid inductor according to some embodiments of the disclosure.
Figure 7A:
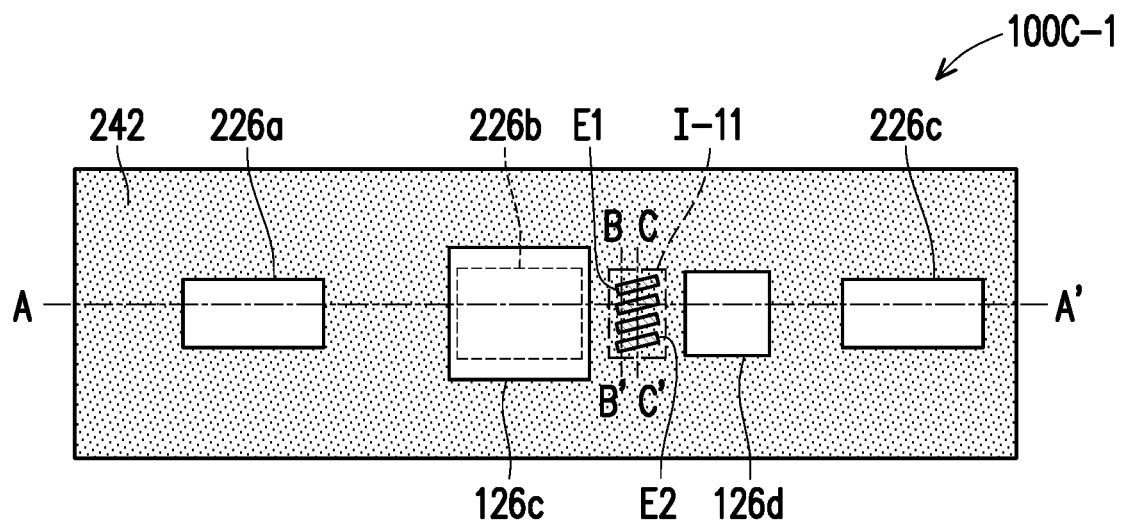
FIG. 7A is a top view illustrating a device package having a 3D solenoid inductor according to some embodiments of the disclosure.
Figure 7B:
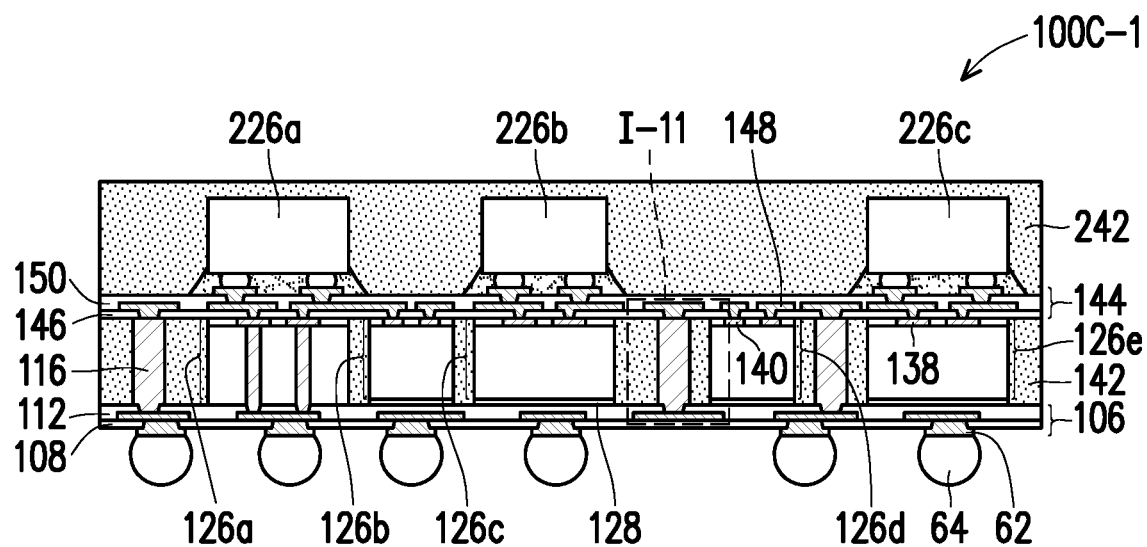
FIG. 7B is a schematic cross-sectional view taken along line A-A' of FIG. 7A.
Figure 7D:
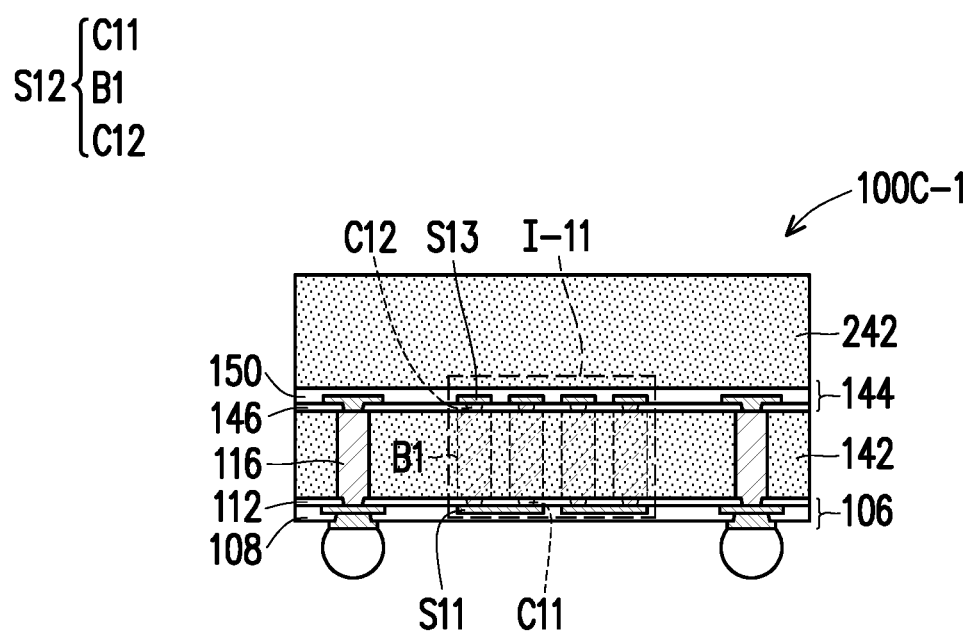
FIG. 7D is a schematic cross-sectional view taken along line C-C' of FIG. 7A.
Figure 8D:
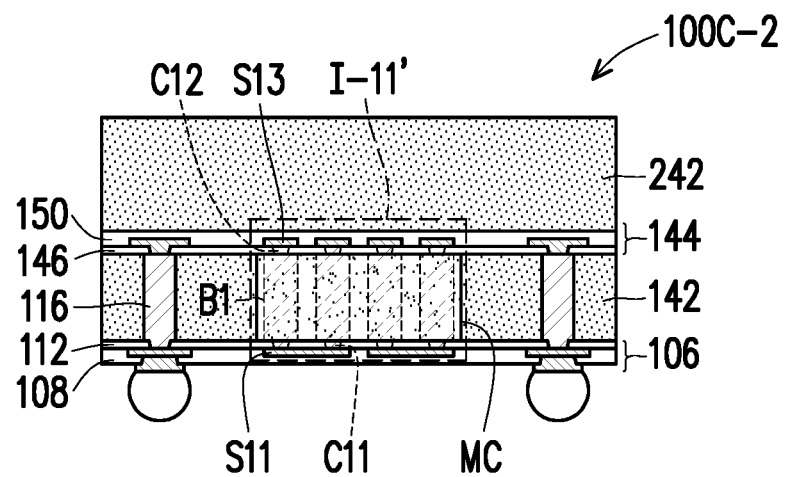
FIG. 8D is a schematic cross-sectional view taken along line C-C' of FIG. 8A.
Figure 9:
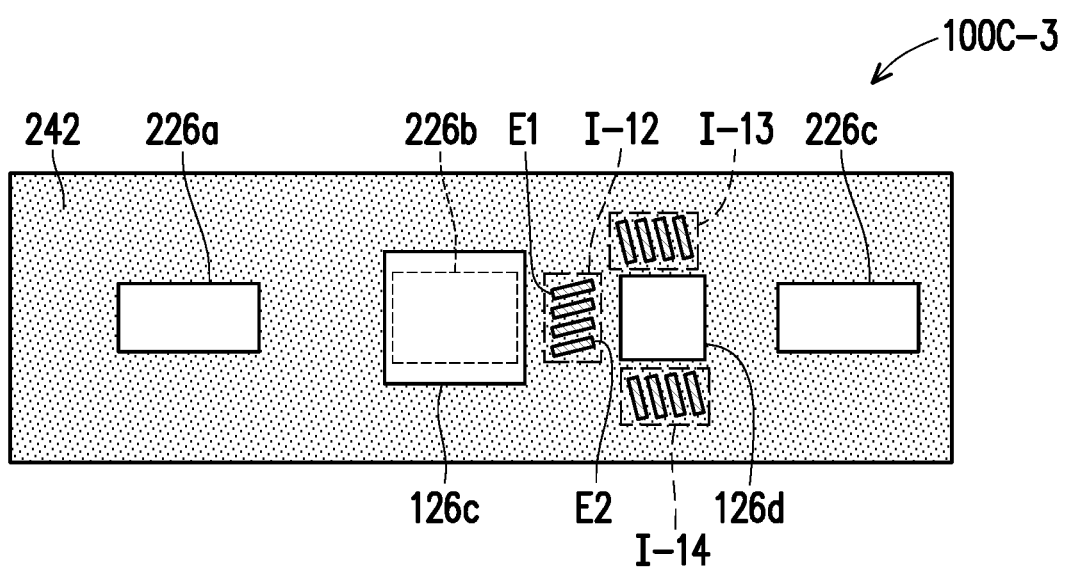
FIG. 9 is a top view illustrating a device package having a plurality of 3D solenoid inductors on a plurality of sides of a die according to some embodiments of the disclosure.

The present disclosure may be used to form a 3D solenoid inductor in an encapsulant of a device package. The 3D solenoid inductor structure is laterally aside a die in the device package, so that a side projection of the 3D solenoid inductor structure at least partially overlaps with a side projection of a die in the device package. The 3D solenoid inductor may be formed simultaneously during the formation of through vias, a first redistribution layer structure, and a second redistribution layer structure. The first redistribution layer structure and the second redistribution layer structure may be two front-side redistribution layer structures as shown in FIGS. 1A to 1G, or a front-side redistribution layer structure and a back-side redistribution layer structure as shown in FIGS. 6A to 6E or FIGS. 10A to 10G. The 3D solenoid inductor may be electrically connected to the die through the second redistribution layer structure as shown in FIG. 2A, or through the first redistribution layer structure as shown in FIG. 3A. The device package may include one or more 3D solenoid inductors with a parallel arrangement as shown in FIGS. 5A to 5D, or with an orthogonal arrangement as shown in FIGS. 4A to 4D. The 3D solenoid inductor(s) may be laterally aside one or more sides of a die of a device package as shown in FIGS. 7A and 9. The 3D solenoid inductor(s) may surround portions of the encapsulant and the dielectric layers as shown in FIG. 7D, or have a magnetic core as shown in FIG. 8D. Some embodiments are described below, but the disclosure is not limited thereto.

FIGS. 1A through 1G are schematic cross-sectional views illustrating a method of manufacturing a device package 100A according to some embodiments of the disclosure. The device packages 100A may also be referred to as integrated fan-out (InFO) packages.

Referring to FIG. 1A, a carrier substrate (or referred to as a substrate) 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages may be formed on the carrier substrate 102 simultaneously. The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

Referring to FIG. 1A, a bottom dielectric layer 108 is formed on the release layer 104. The bottom surface of the bottom dielectric layer 108 may be in contact with the top surface of the release layer 104. In some embodiments, the bottom dielectric layer 108 is formed of a polymer, such as polybenzoxazole (PBO), polyimide (PI), benzocyclobutene (BCB), or the like. In other embodiments, the dielectric layer 108 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 108 may be formed by any acceptable deposition process, such as spin coating, chemical vapor deposition (CVD), laminating, the like, or a combination thereof.

Figure 1B:
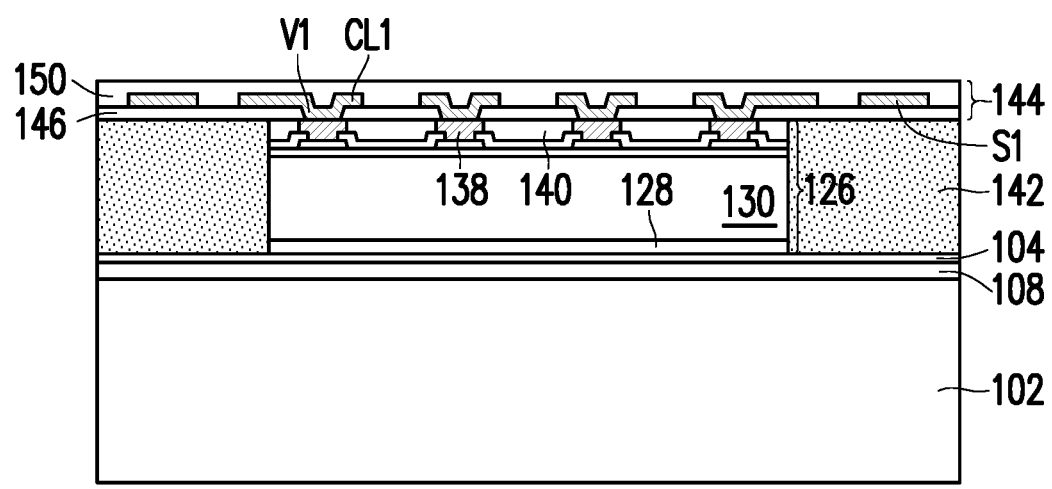

Referring to FIG. 1B, dies 126 are adhered to the release layer 104 by an adhesive 128. For simplicity, only one die 126 is shown. The dies 126 may be integrated circuit (IC) dies such as logic dies (e.g., central processing unit, microcontroller, etc.), memory dies (e.g., dynamic random access memory (DRAM) die, static random access memory (SRAM) die, etc.), high bandwidth memory (HBM) dies, power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), integrated passive device (IPD) dies, application-specific integrated circuit (ASIC) dies, and serializer-deserializer (SerDes) dies, voltage regulator (VR) dies, quartz crystal resonator (XTAL) dies, low temperature co-fired ceramic (LTCC) dies, the like, or a combination thereof. The dies 126 may be semiconductor bridge dies such as silicon bridge dies. Also, in some embodiments, the dies 126 may be in different sizes (e.g., different heights and/or surface areas). In alternative embodiments, the dies 126 may be in the same size (e.g., same heights and/or surface areas).

Figure 1C:
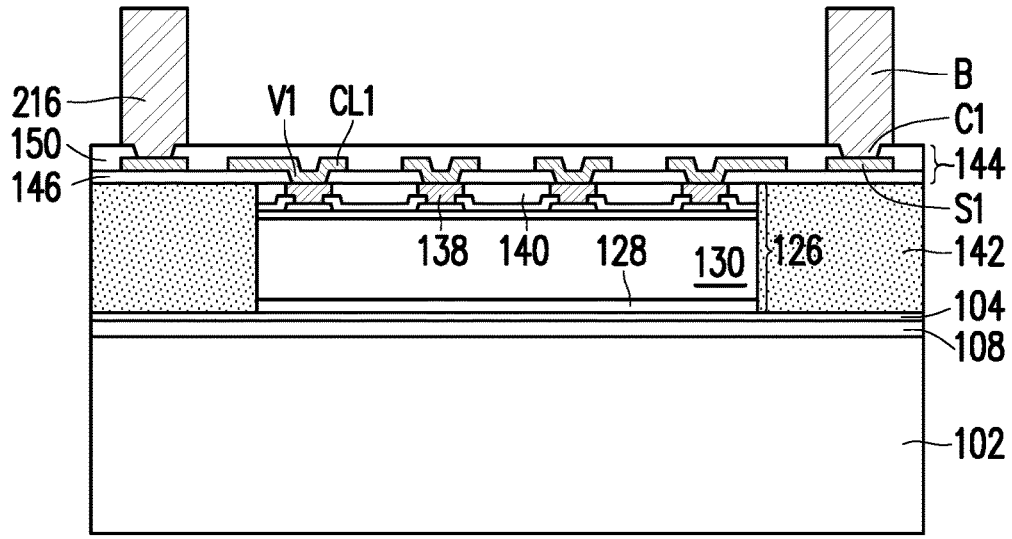

Referring to FIG. 1C, before being adhered to the release layer 104, the dies 126 may be processed according to applicable manufacturing processes to form integrated circuits in the dies 126. For example, the dies 126 may each include a semiconductor substrate 130, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 130 and may be interconnected by interconnect structures 132 formed by, for example, metallization patterns in one or more dielectric layers on the semiconductor substrate 130 to form an integrated circuit.

The dies 126 further include pads 134, such as aluminum pads, to which external connections are made. The pads 134 are on what may be referred to as respective active sides of the dies 126. Passivation films 136 are formed on the interconnect structures 132 and on portions of the pads 134. Openings extend through the passivation films 136 to the pads 134. Die connectors 138, such as conductive pillars (for example, comprising a metal such as copper), extend through the openings in the passivation films 136 and are mechanically and electrically coupled to the corresponding pads 134. The die connectors 138 may be formed by, for example, plating, or the like. The die connectors 138 electrically couple the corresponding integrated circuits of the dies 126.

A dielectric layer 140 is on the active sides of the dies 126, such as on the passivation films 136 and the die connectors 138. The dielectric layer 140 laterally encapsulates the die connectors 138, and the dielectric layer 140 is laterally coterminous with the respective dies 126. The dielectric layer 140 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

The adhesive 128 is on back-side surfaces of the dies 126 and adheres the dies 126 to the bottom dielectric layer 108. In some embodiments, the back-side surfaces s may be referred to as first surfaces or non-active surfaces. The back-side surfaces are opposite to front-side surfaces, the first surfaces are opposite to second surfaces, and the non-active surfaces are opposite to active side surfaces. The adhesive 128 may be applied to the back-side surfaces of the dies 126 before singulating to separate the dies 126. The adhesive 128 may be any suitable adhesive, epoxy, die attach film (DAF), or the like.

Referring to FIG. 1B, an encapsulant 142 is formed on the various components. After formation, the encapsulant 142 laterally encapsulates the dies 126. In some embodiments, the encapsulant 142 includes a molding compound, a molding underfill, a resin such as epoxy, a combination thereof, or the like. In some other embodiments, the encapsulant 142 includes a photo-sensitive material such as polybenzoxazole (PBO), polyimide (PI), benzocyclobutene (BCB), a combination thereof, or the like, which may be easily patterned by exposure and development processes or laser drilling process. In alternative embodiments, the encapsulant 142 includes nitride such as silicon nitride, oxide such as silicon oxide, phosphosilicate glass (PSG), borosilicate glass (BSG), boron-doped phosphosilicate glass (BPSG), a combination thereof, or the like.

In some embodiments, the encapsulant 142 includes a composite material including a base material (such as polymer) and a plurality of fillers in the base material. The filler may be a single element, a compound such as nitride, oxide, or a combination thereof. The fillers may include silicon oxide, aluminum oxide, boron nitride, alumina, silica, or the like, for example. The cross-section shape of the filler may be circle, oval, or any other shape. In some embodiments, the fillers are spherical particles, or the like. In some embodiments, the fillers include solid fillers, but the disclosure is not limited thereto. In some embodiments, a small portion of the fillers may be hollow fillers.

The filler size and filler content of the encapsulant 142 are controlled in a suitable range, and suitable base material and additives are selected to form the encapsulant 142, such that the encapsulant 142 has a good property to provide the encapsulation of the dies 126. For example, the average filler size of the filler may be less than 30 µm. In some embodiments, the content of the fillers in the encapsulant 142 is greater than 70 wt %, such as 70 wt % to 90 wt % or more, based on the total weight of the encapsulant 142. The encapsulant 142 may be applied by compression molding, transfer molding, spin-coating, lamination, deposition, or similar processes, and may be formed over the carrier substrate 102 such that the dies 126 are buried or covered. The encapsulant 142 is then cured.

Referring to FIG. 1B, a planarization process is then performed on the encapsulant 142 to remove a portion of the encapsulant 142, such that the top surfaces of the die connectors 138 are exposed. In some embodiments which the top surfaces of the dies 126 and the encapsulant 142 are not coplanar, portions of the dielectric layer 140 may also be removed by the planarization process. In some embodiments, top surfaces of the die connectors 138, the dielectric layer 140, and the encapsulant 142 are substantially coplanar after the planarization process. The planarization process may be, for example, a chemical-mechanical polish (CMP), a grinding process, or the like. In some embodiments, the planarization may be omitted, for example, if the die connectors 138 are already exposed.

Referring to FIG. 1B, a front-side redistribution layer structure 144 is formed over the front-side surfaces (or referred to as active surfaces) of the dies 126, and the encapsulant 142. The front-side redistribution layer structure 144 includes dielectric layers 146, and 150; and metallization patterns 148. The metallization patterns 148 may also be referred to as redistribution layers or redistribution lines. The front-side redistribution layer structure 144 is shown as an example. More dielectric layers and metallization patterns may be formed in the front-side redistribution layer structure 144. If more dielectric layers and metallization patterns are to be formed, steps and processes discussed below may be repeated.

As an example to form the front-side redistribution layer structure 144, the dielectric layer 146 is deposited on the encapsulant 142, the dielectric layers 140 and the die connectors 138. In some embodiments, the dielectric layer 146 is formed of a photo-sensitive material such as PBO, polyimide, BCB, or the like, which may be patterned using a lithography mask. The dielectric layer 146 may be formed by spin coating, lamination, CVD, the like, or a combination thereof. The dielectric layer 146 is then patterned. The patterning forms via openings (not shown) exposing portions of the die connectors 138. The patterning may be by an acceptable process, such as by exposing the dielectric layer 146 to light when the dielectric layer 146 is a photo-sensitive material or by etching using, for example, an anisotropic etch. If the dielectric layer 146 is a photo-sensitive material, the dielectric layer 146 may be developed after the exposure.

The metallization pattern 148 is then formed. The metallization patterns 148 include conductive lines CL1 and conductive vias V1. The conductive lines CL1 are formed on and extending along the top surface of the dielectric layer 146. The conductive vias V1 are formed extending through the dielectric layer 146 to be physically and electrically connect to the dies 126. The metallization patterns 148 further include a first segment S1 of an 3D solenoid inductor I-1 as shown in FIG. 1G. In some embodiments, the first segment S1 may be electrically connected to the die 126 through the conductive lines CL1 and the conductive vias V1. In alternative embodiments, the first segment S1 of the 3D solenoid inductor I-1 is not electrically connected to the die 126. The sidewalls of the conductive vias V1, the conductive lines CL1, and the first segment S1 may be straight or inclined. In some embodiments, the conductive via V1 have inclined sidewalls and are tapered toward the dies 126. In addition, the metallization pattern 148 may be a conformal layer, and has a recess on the conductive via V1.

To form the metallization pattern 148, a seed layer is formed over the dielectric layer 146 and in the openings extending through the dielectric layer 146. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 148. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 148. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The dielectric layer 150 is formed on the dielectric layer 146 and the metallization pattern 148. In some embodiments, the dielectric layer 150 is formed of a photo-sensitive material such as PBO, polyimide, BCB, or the like, which may be patterned using a lithography mask. The dielectric layer 150 may be formed by spin coating, lamination, CVD, the like, or a combination thereof. The dielectric layer 150 may be formed in a manner similar to the dielectric layer 146, and may be formed of the same material as the dielectric layer 146.

Referring to FIG. 1C, the dielectric layer 150 is then patterned. The patterning forms via openings (not shown) exposing portions of the metallization pattern 148. The patterning may be by an acceptable process, such as by exposing the dielectric layer 150 to light when the dielectric layer 150 is a photo-sensitive material or by etching using, for example, an anisotropic etch. If the dielectric layer 150 is a photo-sensitive material, the dielectric layer 150 may be developed after the exposure.

Conductive pillars 216 are formed on the dielectric layer 150 and in the via openings. One of the conductive pillars 216 is formed to electrically connected to the metallization pattern 148. The other one of the conductive pillars 216 is formed to electrically connected to the first segment S1 of the 3D solenoid inductor I-1. As an example, to form the conductive pillars 216, a seed layer is formed over the dielectric layer 150 and in the via openings. In some embodiments, the seed layer is a metal layer, which may be a single layer or a composite layer comprising a plurality of sub-layers formed of different materials. For example, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the conductive pillars 216.

Figure 1D:
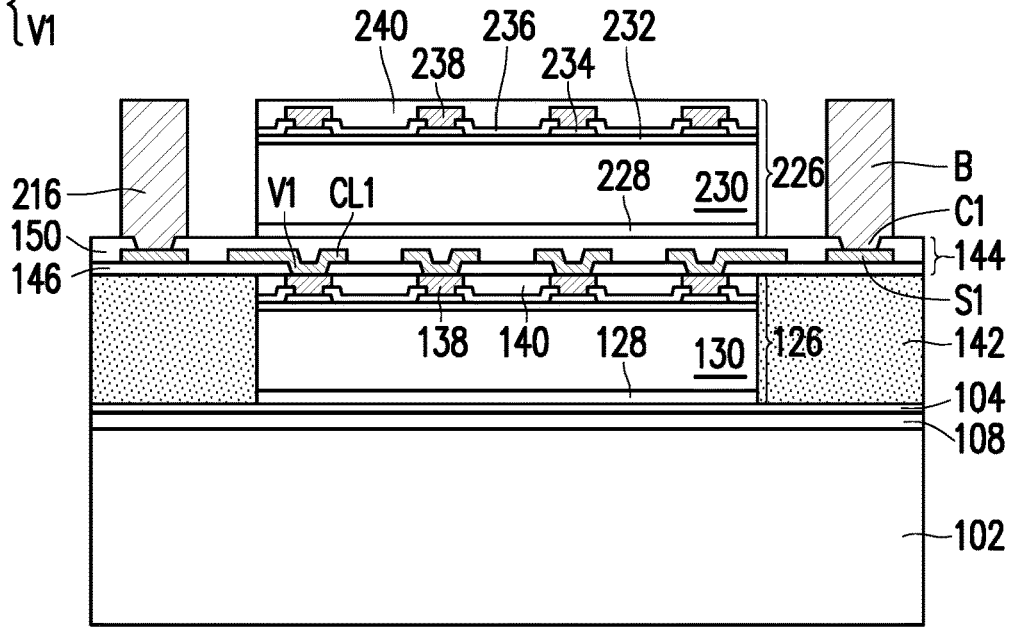

Referring to FIG. 1D, after the conductive pillars 216 are formed, dies 226 are placed on the front-side redistribution layer structure 144. In some embodiments, the dies 226 and the dies 126 are stacked in a back-to-face manner. The integrated circuit dies 226 are adhered to the front-side redistribution layer structure 144 by an adhesive 228. For simplicity, only one die 226 is shown. The dies 226 are integrated circuit dies, and may be logic dies (e.g., central processing unit, microcontroller, etc.), memory dies (e.g., dynamic random access memory (DRAM) die, static random access memory (SRAM) die, etc.), high bandwidth memory (HBM) dies, power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), integrated passive device (IPD) dies, application-specific integrated circuit (ASIC) dies, and serializer-deserializer (SerDes) dies, voltage regulator (VR) dies, quartz crystal resonator (XTAL) dies, low temperature co-fired ceramic (LTCC) dies, the like, or a combination thereof. Also, in some embodiments, the integrated circuit dies 226 may be different sizes (e.g., different heights and/or surface areas), and in other embodiments, the integrated circuit dies 226 may be the same size (e.g., same heights and/or surface areas). The integrated circuit dies 226 and the integrated circuit dies 126 may be different sizes (e.g., different heights and/or surface areas), and in other embodiments, the integrated circuit dies 226 and the integrated circuit dies 126 may be the same size (e.g., same heights and/or surface areas) as shown in 1D. In some embodiments, the integrated circuit dies 226 may be placed directly above the die 126 as shown in FIG. 1D. In alternative embodiments, the die 226 may be offset from the die 126 (not shown). The adhesive 228 may be formed in a manner similar to the adhesive 128, and may be formed of the same material as the adhesive 128.

Before being adhered to the front-side redistribution layer structure 144, the integrated circuit dies 226 may be processed according to applicable manufacturing processes to form integrated circuits in the integrated circuit dies 226. For example, the dies 226 each include a semiconductor substrate 230, devices, interconnect structures 232, pads 234, passivation films 236, and die connectors 238. In some embodiments, the substrate 230, the devices, the interconnect structures 232, the pads 234, the passivation films 236, and the die connectors 238 may be formed in a manner similar to the substrate 130, the devices, the interconnect structures 132, the pads 134, the passivation films 136, and the die connectors 138, and may be formed of the same material as the substrate 130, the devices, the interconnect structures 132, the pads 134, the passivation films 136, and the die connectors 138, respectively.

Figure 1E:
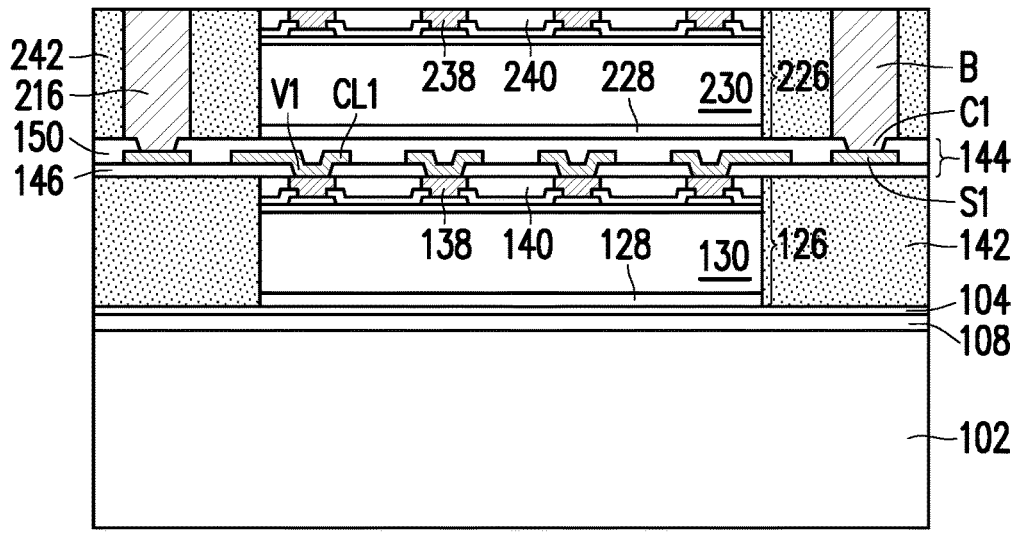

Referring to FIG. 1E, an encapsulant 242 is formed on the various components. After formation, the encapsulant 242 laterally encapsulates the conductive pillars 216 and the integrated circuit dies 226. In some embodiments, the encapsulant 242 includes a molding compound, a molding underfill, a resin such as epoxy, a combination thereof, or the like. In some other embodiments, the encapsulant 242 includes a photo-sensitive material such as polybenzoxazole (PBO), polyimide (PI), benzocyclobutene (BCB), a combination thereof, or the like, which may be easily patterned by exposure and development processes or laser drilling process. In alternative embodiments, the encapsulant 242 includes nitride such as silicon nitride, oxide such as silicon oxide, phosphosilicate glass (PSG), borosilicate glass (BSG), boron-doped phosphosilicate glass (BPSG), a combination thereof, or the like.

In some embodiments, the encapsulant 242 includes a composite material including a base material (such as polymer) and a plurality of fillers in the base material. The filler may be a single element, a compound such as nitride, oxide, or a combination thereof. The fillers may include silicon oxide, aluminum oxide, boron nitride, alumina, silica, or the like, for example. The cross-section shape of the filler may be circle, oval, or any other shape. In some embodiments, the fillers are spherical particles, or the like. The cross-section shape of the filler may be circle, oval, or any other shape. In some embodiments, the fillers include solid fillers, but the disclosure is not limited thereto. In some embodiments, a small portion of the fillers may be hollow fillers.

The filler size and filler content of the encapsulant 242 are controlled in a suitable range, and suitable base material and additives are selected to form the encapsulant 242, such that the encapsulant 242 has a good property to provide the encapsulation of the integrated circuit dies 226. For example, the average filler size of the filler may be less than 30 μm. In some embodiments, the content of the fillers in the encapsulant 242 is greater than 70 wt %, such as 70 wt % to 90 wt % or more, based on the total weight of the encapsulant 242. In some embodiments, the encapsulant 242 has a dielectric loss tangent less than 0.01.

In some embodiments, the encapsulant 242 may be formed in a manner similar to the encapsulant 242, and may be formed of the same material as the encapsulant 242. The encapsulant 242 may be applied by compression molding, transfer molding, spin-coating, lamination, deposition, or similar processes, and may be formed over the carrier substrate 102 such that the conductive pillars 216 and/or the integrated circuit dies 226 are buried or covered. The encapsulant 242 is then cured.

Referring to FIG. 1B, a planarization process is then performed on the encapsulant 242 to remove a portion of the encapsulant 242, such that the top surfaces of the conductive pillars 216 and the die connectors 238 are exposed. In some embodiments in which the top surfaces of the conductive pillars 216 and the front-side surfaces of the integrated circuit dies 226 are not coplanar (as shown in FIG. 1A), portions of the conductive pillars 216 or/and portions of the dielectric layer 240 may also be removed by the planarization process. In some embodiments, top surfaces of the conductive pillars 216, the die connectors 238, the dielectric layer 240, and the encapsulant 242 are substantially coplanar after the planarization process. The conductive pillars 216 penetrate the encapsulant 242, and the conductive pillars 216 are sometimes referred to as through vias 216 or through integrated fan-out vias (TIVs) 216. The planarization process may be, for example, a chemical-mechanical polish (CMP), a grinding process, or the like. In some embodiments, the planarization may be omitted, for example, if the through vias 216 and die connectors 238 are already exposed.

The through via 216 or the through integrated fan-out via (TIV) 216 which is in contact with the first segment S1 of the 3D solenoid inductor I-1 may be referred to as a connect portion C1 and a body B of a second segment S2 of the 3D solenoid inductor I-1 shown in FIG. 1G. The connect portion C1 of the second segment S2 is in contact with the first segment S1 of the 3D solenoid inductor I-1. The sidewalls of the connect portion C1 may be straight or inclined. In some embodiments, the connect portion C1 has inclined sidewalls and is tapered toward the first segment S1. The body B is in contact with the connect portion C1, but there is no interface therebetween.

Figure 1F:
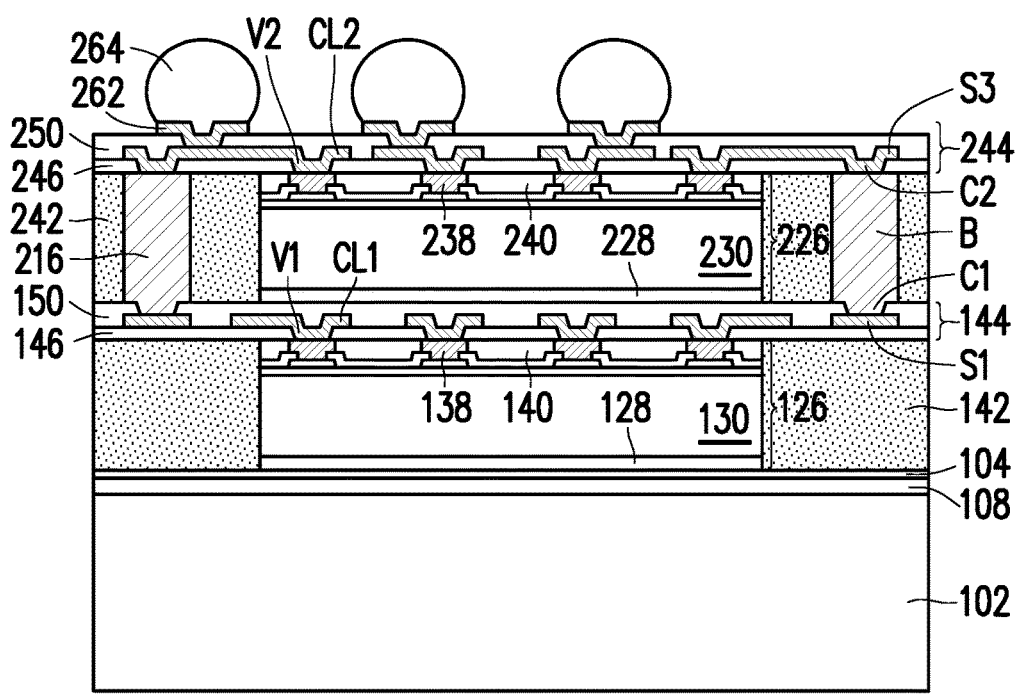
Figure 1G:
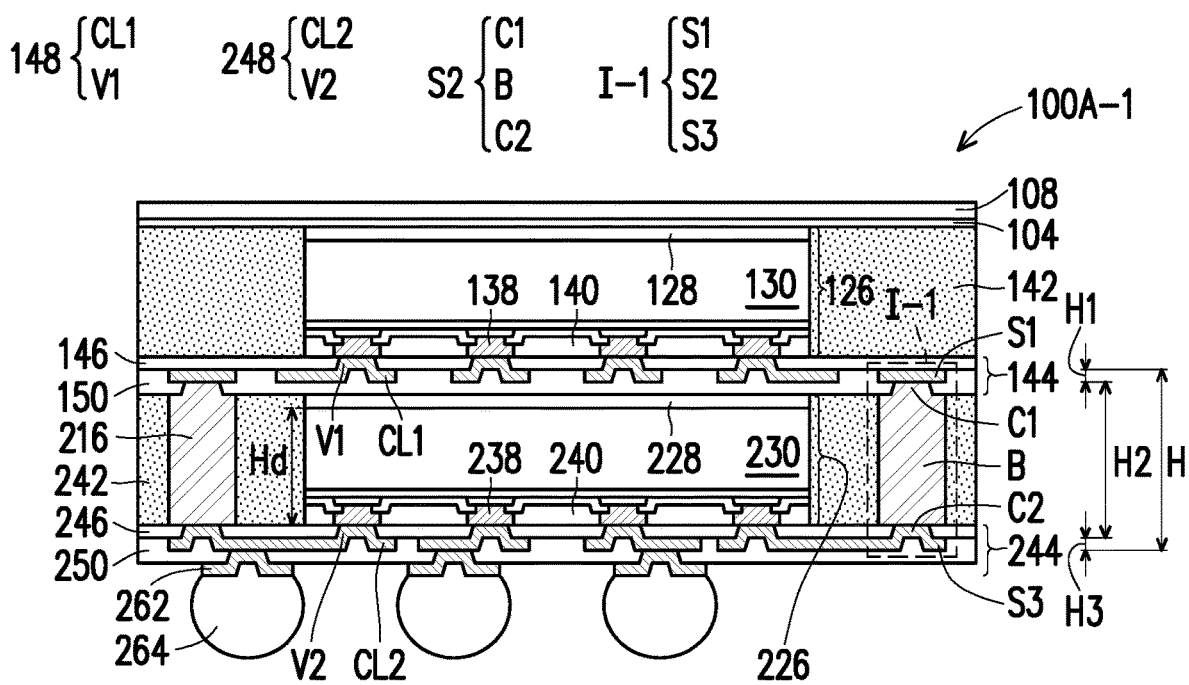

Referring to FIG. 1F, a front-side redistribution layer structure 244 is formed over front-side surfaces of the through vias 216, front-side surfaces of the encapsulant 242, and front-side surfaces of the integrated circuit dies 226. The front-side redistribution layer structure 244 includes dielectric layers 246, and 250; metallization patterns 248; and under bump metallurgies (UBMs) 260. The metallization patterns may also be referred to as redistribution layers or redistribution lines. The front-side redistribution layer structure 244 is shown as an example. More dielectric layers and metallization patterns may be formed in the front-side redistribution layer structure 244. If more dielectric layers and metallization patterns are to be formed, steps and processes discussed below may be repeated.

As an example to form the front-side redistribution layer structure 244, the dielectric layer 246 is deposited on the encapsulant 242, the through vias 216, and the die connectors 238. In some embodiments, the dielectric layer 246 is formed of a photo-sensitive material such as PBO, polyimide, BCB, or the like, which may be patterned using a lithography mask. The dielectric layer 246 may be formed by spin coating, lamination, CVD, the like, or a combination thereof. The dielectric layer 246 is then patterned. The patterning forms openings exposing portions of the through vias 216 and the die connectors 238. The patterning may be by an acceptable process, such as by exposing the dielectric layer 246 to light when the dielectric layer 246 is a photo-sensitive material or by etching using, for example, an anisotropic etch. If the dielectric layer 246 is a photo-sensitive material, the dielectric layer 246 may be developed after the exposure.

The metallization pattern 248 is then formed. The metallization pattern 248 includes conductive lines CL2 and conductive vias V2. The conductive lines CL2 are formed on and extending along the top surface of the dielectric layer 246. The conductive vias V2 are formed extending through the dielectric layer 246 to be physically and electrically connected to the through vias 216 and the integrated circuit dies 226. The metallization pattern 248 further comprises a connect portion C2 of the second segment S2 and a third segment S3 of the 3D solenoid inductor I-1. The connect portion C2 and the body B of the second segment S2 of the 3D solenoid inductor I-1 are in contact with each other, and have an interface therebetween. The third segment S3 and the connect portion C2 of the second segment S2 are in contact with each other, and there is no interface therebetween.

The sidewalls of the conductive vias V2, the conductive lines CL2, the connection C2 and the third segment S3 may be straight or inclined. In some embodiments, the conductive via V2 and the connection C2 have inclined sidewalls and are tapered toward the integrated circuit dies 226 and the body B. To form the metallization pattern 248, a seed layer is formed over the dielectric layer 246 and in the openings extending through the dielectric layer 246. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 248. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 248. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The dielectric layers 250 is formed on the dielectric layer 246 and metallization pattern 248. The dielectric layer 250 may be formed in a manner similar to the dielectric layer 246, and may be formed of the same material as the dielectric layer 246. UBMs 262 are optionally formed on and extending through the dielectric layer 250. The UBMs 262 may be formed in a manner similar to the metallization pattern 248, and may be formed of the same material as the metallization pattern 248.

Referring to FIG. 1G, conductive connectors 264 are formed on the UBMs 262 to form a component. The conductive connectors 264 may be electrically connected to the dies 226 through the UBMs 262, the conductive lines CL2 and conductive vias V2. The conductive connectors 264 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 264 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. In another embodiment, the conductive connectors 264 may include a conductive material such as solder, copper, aluminum, gold, nickel, silver, palladium, tin, the like, or a combination thereof. In some embodiments, the conductive connectors 264 are formed by initially forming a layer of solder through such commonly used methods such as evaporation, electroplating, printing, solder transfer, ball placement, or the like. Once a layer of solder has been formed on the structure, a reflow process may be performed in order to shape the material into the desired bump shapes.

Referring to FIG. 1G, the component is then flipped over and placed on a tape (not shown). A carrier substrate de-bonding is performed to detach (or "de-bond") the carrier substrate 102 from the bottom dielectric layer 108 to form.

In accordance with some embodiments, the de-bonding includes projecting a light such as a laser light or an UV light on the release layer 104 so that the release layer 104 decomposes under the heat of the light and the carrier substrate 102 may be removed. Thereafter, the component is singulated to form device packages 100A-1. The singulation may be by sawing, dicing, or the like.

The device package 100A-1 include the 3D solenoid inductor I-1. The 3D solenoid inductor I-1 is portions of the front-side redistribution layer structure 144, the through vias 216, and the front-side redistribution layer structure 244. The 3D solenoid inductor I-1 is embedded in the front-side redistribution layer structure 144, the encapsulate 242 and the front-side redistribution layer structure 244. The 3D solenoid inductor I-1 includes the first segment S1, the third segment S3, and the second segment S2 between and connected to the first segment S1 and the third segment S3. In some embodiments, the height H1 of the first segments S1 and the height H3 of the third segments S3 are less than the height H2 of the second segment S2. The first segment S1 of the 3D solenoid inductor I-1 is embedded in the dielectric layers 146 and 150 of the front-side redistribution layer structure 144. The third segment S3 is embedded in the dielectric layers 246 and 250 of the front-side redistribution layer structure 244. The second segment S2 includes a connect portion C1, a connect portion C2, and a body B therebetween. The connect portion C1 of the second segment S2 is embedded in the dielectric layer 150. The connect portion C2 is embedded in the dielectric layer 246. The body B is embedded in the encapsulate 242.

Figure 2B:
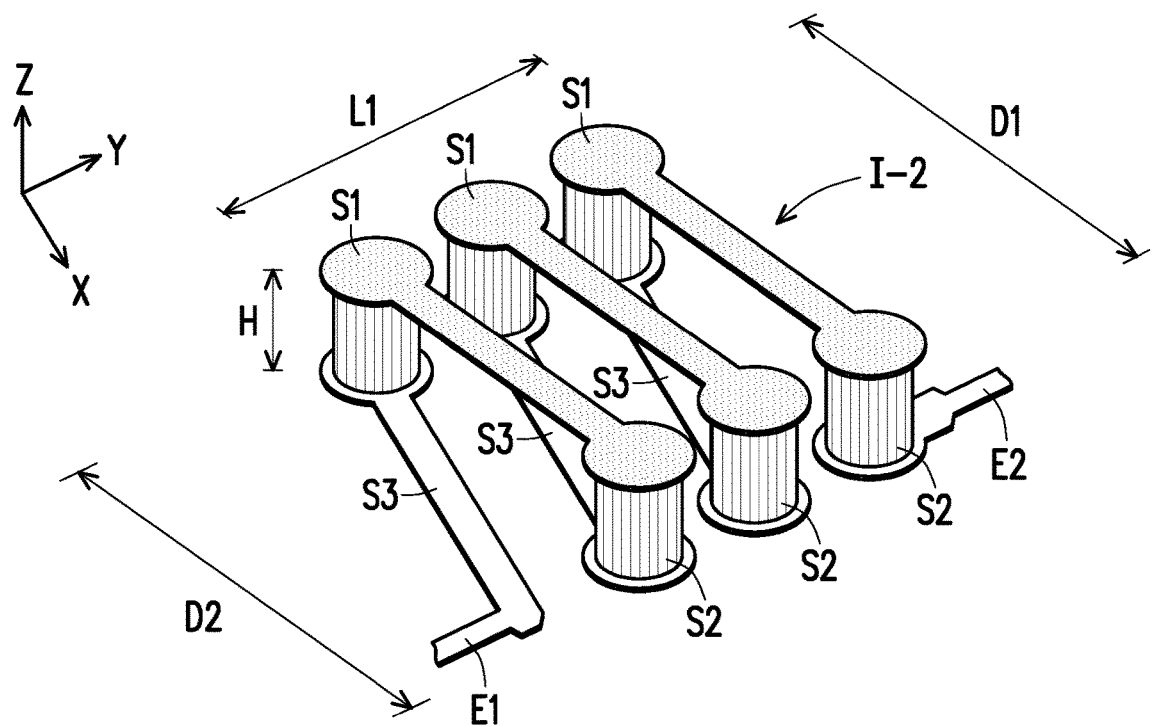
FIG. 2B is a perspective view illustrating the 3D solenoid inductor in the device package shown in FIG. 2A.
Figure 3B:
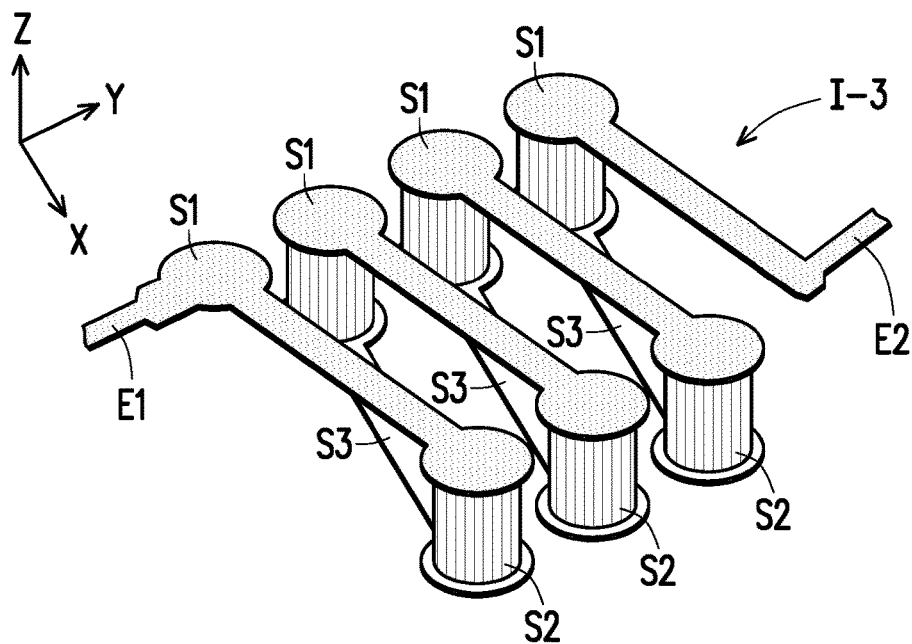
FIG. 3B is a perspective view illustrating the 3D solenoid inductor in the device package shown in FIG. 3A.

In some embodiments, 3D solenoid inductor may include a plurality of first segments S1, a plurality of second segments S2, and a plurality of third segments S3 as shown in FIGS. 2B and 3B.

Referring to FIGS. 2A and 2B, the 3D solenoid inductor I-2 included in a device package 100A-2 includes a includes a plurality of first segments S1, a plurality of second segments S2, and a plurality of third segments S3. In some embodiments, the first segments S1 have substantially the same height H1, the second segments S2 have substantially the same height H2, and the third segments S3 have substantially the same height H3. The height H1 of the first segments S1 and the height H3 of the third segments S3 is less than the height H2 of the second segments S2.

The first segments S1 are a portion of the front-side redistribution layer structure 144. In some embodiments, the first segments S1 and the conductive line CL1 of the front-side redistribution layer structure 144 are arranged at the same level. Each of the first segments S1 may be a straight line extending on a surface substantially parallel to the active surface of the die 126. The first segments S1 may be arranged in parallel. In some embodiments, each straight line may have a single length D1 and a single width (not shown). In other some embodiments, the width of the ends of each straight line is greater than the width of the middle of each straight line as shown in FIG. 2B. A top surface, sidewalls and a portion of the first segments S1 are covered with the dielectric layers 146 and 150 of the front-side redistribution layer structure 144. The top surface of each first segment S1 is a flat plane in some embodiments.

The third segments S3 are a portion of the front-side redistribution layer structure 244. In some embodiments, the third segments S3 and the conductive line CL2 of the front-side redistribution layer structure 244 are arranged at the same level. Each of the third segments S3 may be a straight line extending on a surface substantially parallel to the active surface of the die 226. In some embodiments, the third segment S3 and the first segment S1 extend in different directions. The third segments S3 may be arranged in parallel. In some embodiments, each straight line may have a single length D2 and a single width (not shown). The length D2 of the third segments S3 may be the same as the length D1 of the first segments S1. In other some embodiments, the width of the end of each straight line is greater than the width of the middle of each straight line as shown in FIG. 2B. A top surface, sidewalls and a portion of the third segments S3 are covered with the dielectric layers 246 and 250 of the front-side redistribution layer structure 244. In some embodiments, most of the bottom surface of each third segments S3 is a flat plane, but there is a recess R below the second segment S2 toward the second segment S2 in some embodiments.

Each of the second segments S2 extends on a normal line of the active surface of the die 226. The second segment S2 is disposed between and connected to the first segment S1 and the third segment S3. In some embodiments, the second segments S2 are perpendicular to the first segment S1 and the third segment S3. The height H2 of the second segment S2 is greater than a height Hd of the die 226. In some embodiments, the second segments S2 are arranged in two rows or two columns that are substantially parallel.

The second segment S2 includes a connect portion C1, a connect portion C2, and a body B therebetween. In some embodiments, a maximum width of the body B is greater than a maximum width of the connect C1 and a maximum width of the connect C2, and a height of the body B is greater than a height of the connect C1 and a height of the connect C2. The connect portion C1 passes through the dielectric layer 150 and is connected to the first segments S1. The connect portion C1 and the first segment S1 are not integrated, and have an interface therebetween. The sidewall of the connect portion C1 may be straight or inclined. In some embodiments, the connect portion C1 has inclined sidewalls and is tapered toward the first segment S1.

Each of the bodies B is connected to the connect portions C1 and C2. The body B and the connect portion C1 are integrated, therefore there is no interface therebetween. The body B and the connect portion C2 are not, integrated, and have an interface therebetween. A portion of a top surface of the body B is covered with the dielectric layer 150 of the front-side redistribution layer structure 144. Sidewalls of the body B are encapsulated by the encapsulate 242. A portion of bottom surface of the body B is covered with the dielectric layer 246 of the front-side redistribution layer structure 244. In some embodiments, portion of a top surface of the body B is substantially coplanar with a top surface of the encapsulate 242, and portion of a bottom surface of the body B is substantially coplanar with a bottom surface of the encapsulate 242.

The connect C2 is connected to the body B. The connect C2 and the third segment S3 are integrated, therefore there is no interface therebetween. Sidewalls of the connect C2 are covered with the dielectric layer 246 of the front-side redistribution layer structure 244. In some embodiments, the connect portion C2 has inclined sidewalls and is tapered toward the body B.

A length L1 of the 3D solenoid inductor I-2 is defined by the distance between the first and last first segments S1 in the same row. The length L1 of the 3D solenoid inductor I-2 may be greater than, equal to, or less than the length of the side of the die 226 adjacent to the 3D solenoid inductor I-2. A height H of the 3D solenoid inductor I-2 is defined by the sum of the height H1 of the first segments S1, the height H2 of the second segments S2, and the height H3 of the third segments S3. The height H2 of the second segments S2 is greater than the height H2 of the die 226. A width of a spacing between two adjacent bodies B of the second segments S2 may be greater than a width of the body B.

The 3D solenoid inductor I-2 have ends E1 and E2. In some embodiments, the end E1 is coupled to the die 226, while the end E2 is grounded. In alternative embodiments, the end E1 is coupled to the die 226, while the end E2 is coupled to the other die. The ends E1 and E2 may be two of the segments S3 or S1 of the 3D solenoid inductor I-2. In some embodiments, two third segments S3 at the outer sides of the 3D solenoid inductor I-2 are served as the ends E1 and E2, so that the 3D solenoid inductor i-2 is electrically connected to the die 226 as shown in FIG. 2A. In alternative embodiments, two first segments S1 at the outer sides of the 3D solenoid inductor I-3 included a device package 100A-3 are served as the ends E1 and E2, so that the 3D solenoid inductor I-3 is electrically connected to the die 126 as shown in FIG. 3A.

One or more 3D solenoid inductors may be included in each device package. In an embodiment in which a plurality of 3D solenoid inductors included in one device package, the 3D solenoid inductors may be arranged in various ways. In some embodiments, 3D solenoid inductors I-4 and I-4' have an orthogonal arrangement as shown in FIGS. 4A to 4D. In alternative embodiments, 3D solenoid inductors I-5 and I-5' have a parallel arrangement as shown in FIGS. 5A to 5D.

Referring to FIGS. 4A to 4D and 5A to 5D, the 3D solenoid inductors I-4 and I-5 include first segments S1, second segments S2, and third segments S3, respectively, while the 3D solenoid inductors I-4' and I-5' include first segments S1', second segments S2', and third segments S3', respectively. The first segments S1 and S1' are a portion of a first redistribution layer structure of a device package, respectively, the second segments S2 and S2' are a portion of TIVs of the device package, and the third segments S3 and S3' are a portion of a second redistribution layer structure of the device package, respectively.

In some embodiments, the 3D solenoid inductors I-4 and I-5 have an end E1 coupled to a first die of the device package, and an end E2 coupled to a ground plate G, respectively. The 3D solenoid inductors I-4' and I-5' have an end E1' coupled to the first die or another die of the device package, and an end E2' coupled to a ground plate G', respectively.

Figure 4A:
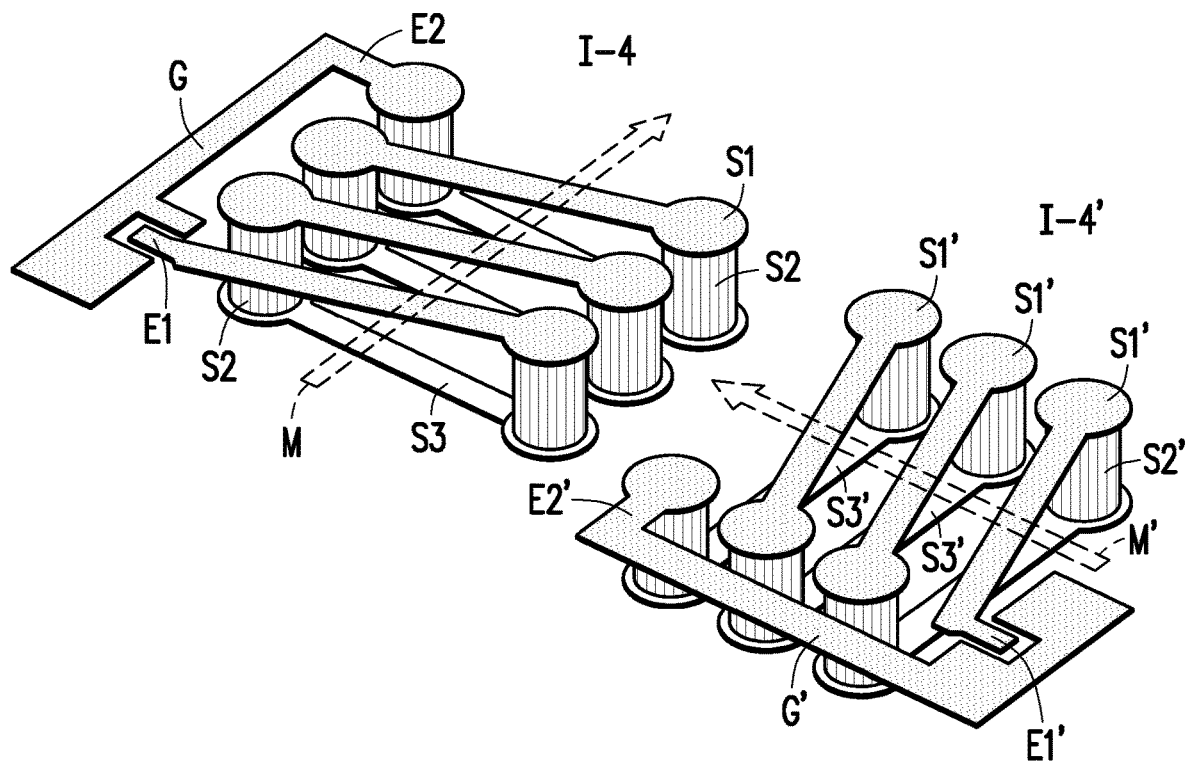
FIG. 4A is a perspective view illustrating 3D solenoid inductors have an orthogonal arrangement according to some embodiments of the disclosure.
Figure 4B:
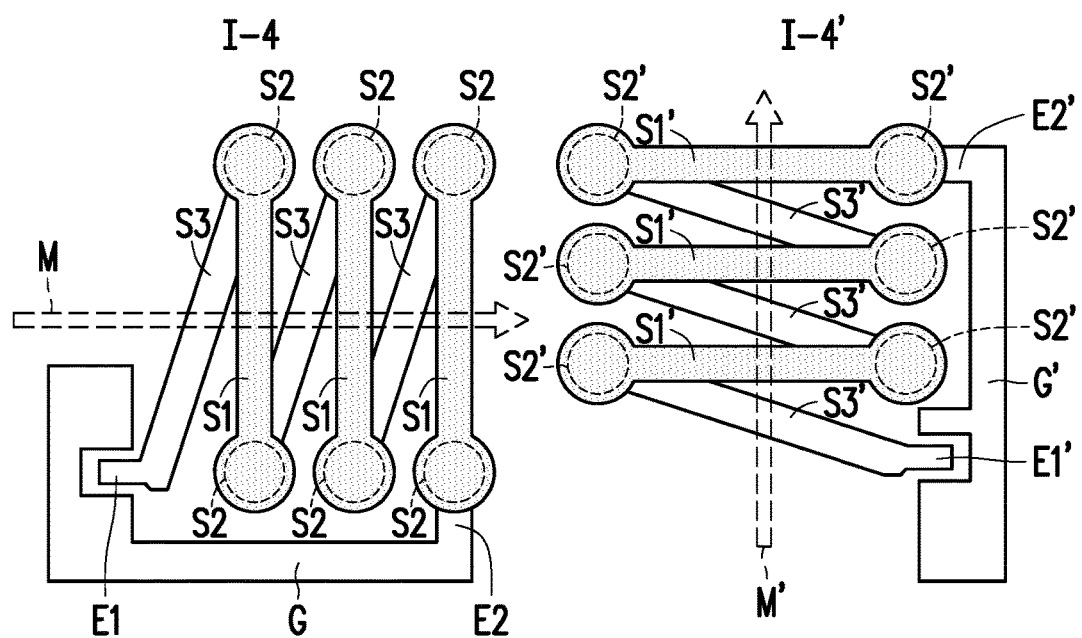
FIGS. 4B through 4D are schematic cross-sectional views illustrating 3D solenoid inductors have an orthogonal arrangement according to some embodiments of the disclosure.
Figure 4C:
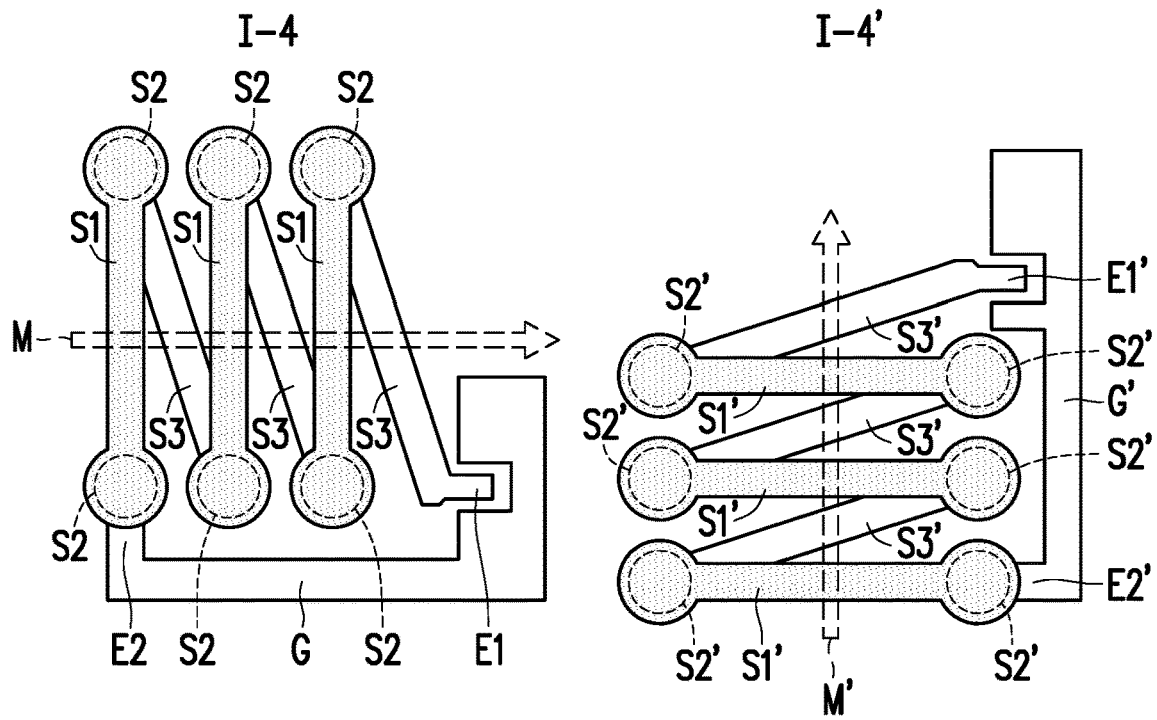
Figure 4D:
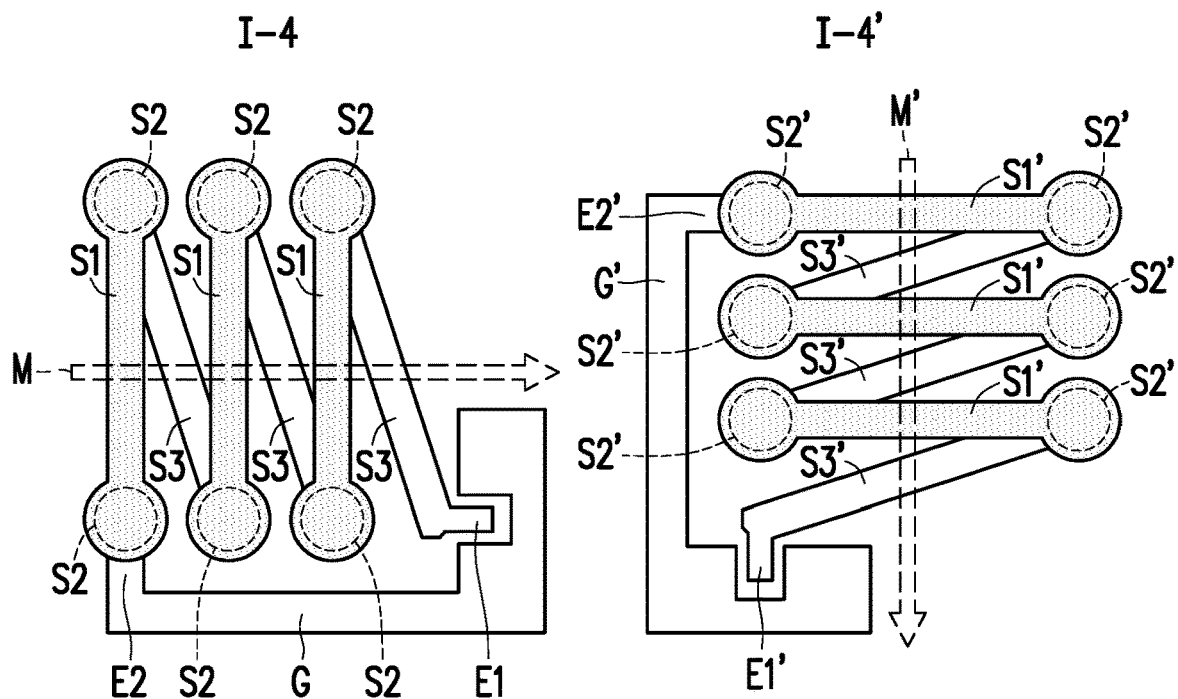
Figure 5A:
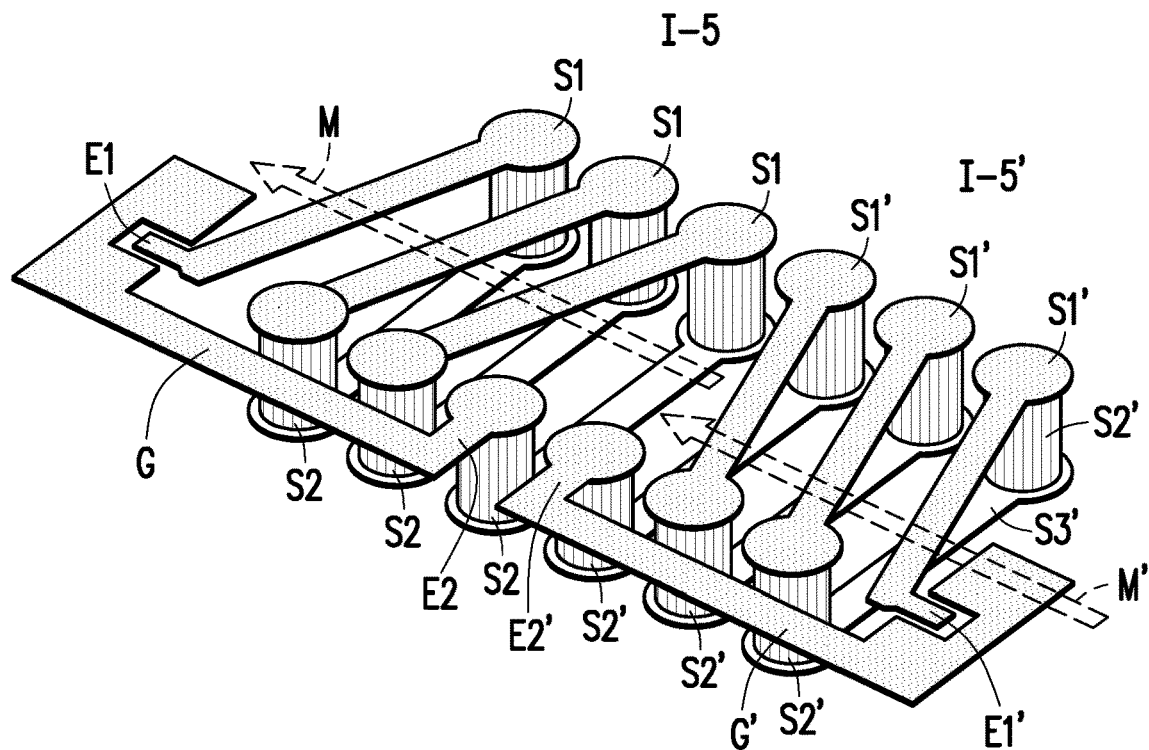
FIG. 5A is a perspective view illustrating two 3D solenoid inductors have a parallel arrangement according to some embodiments of the disclosure.

In some embodiments, the ends E1 and E2, and the ends E1' and E2' may be two first segments S1 and two first segments S ', respectively, as shown in FIGS. 4A and 5A. In alternative embodiments, the ends E1 and E2, and the ends E1' and E2' may be two third segments S3, and two third segments S3', respectively, as shown in FIGS. 4B to 4D, and 5B to 5D.

Figure 5B:
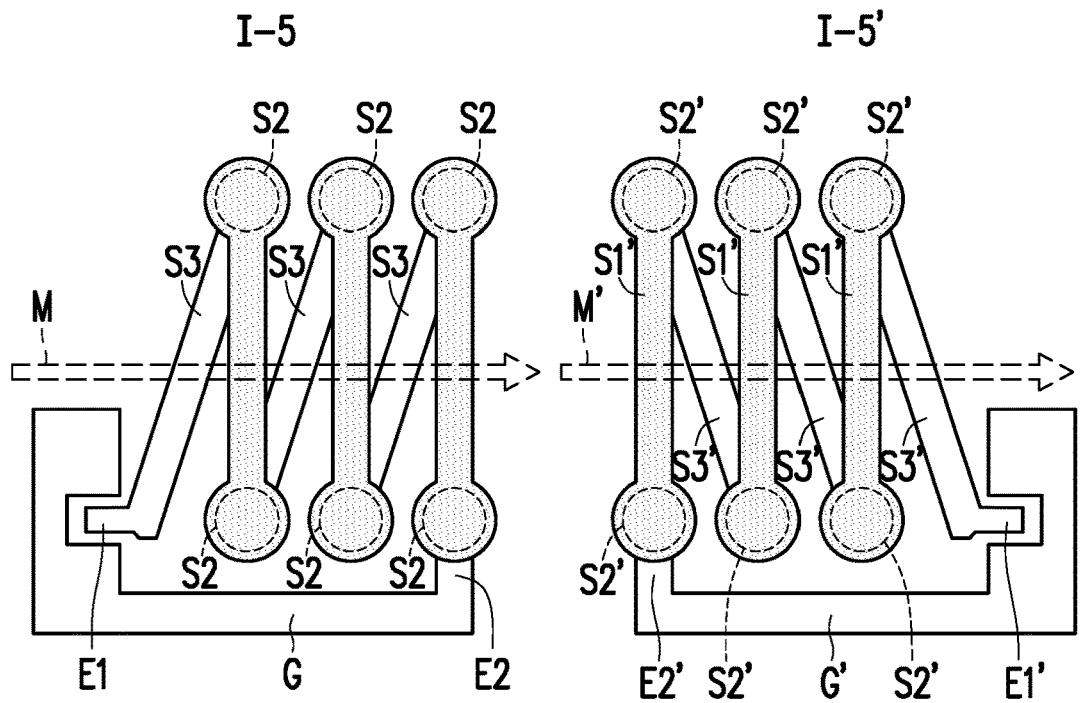
FIGS. 5B through 5D are schematic cross-sectional views illustrating 3D solenoid inductors have a parallel arrangement according to some embodiments of the disclosure.
Figure 5C:
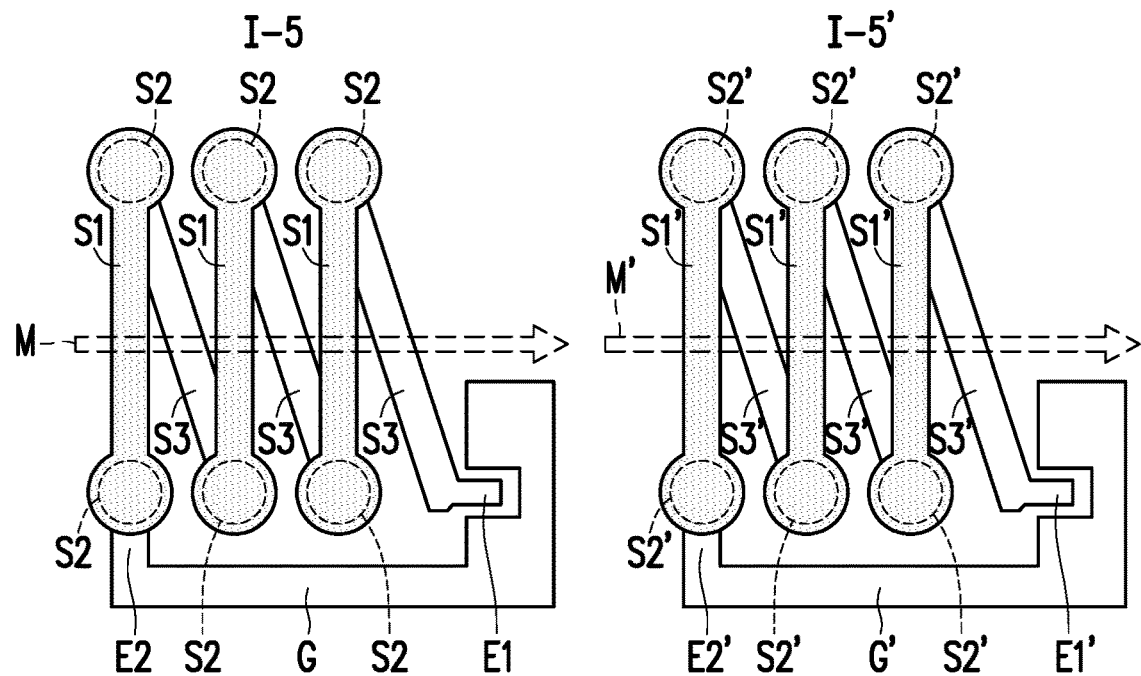
Figure 5D:
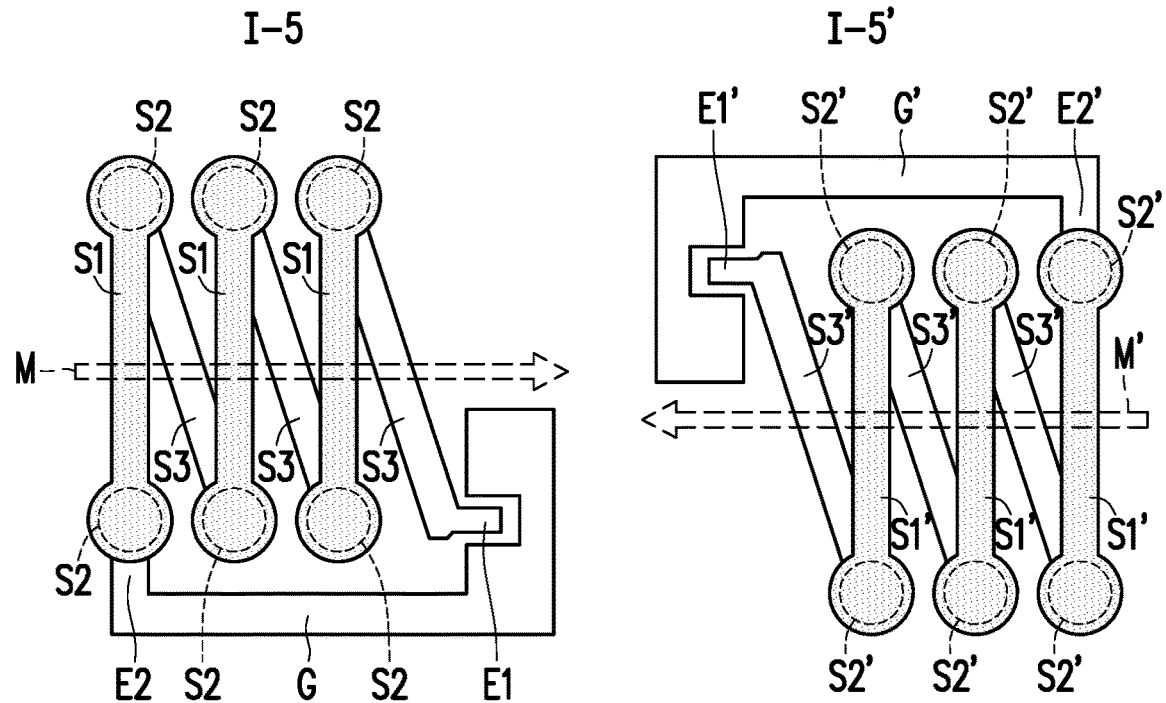

The positions of the ends E1 and E2, or the ends E1' and E2' may be adjusted and changed according to the position of the die to which the 3D solenoid inductor to be coupled. The end E2 is higher than the end E1, while the end E1' is closer to the right than the end E2' as shown in FIG. 4A. The end E1 is closer to the left than the end E2, while the end E2' is higher than the end E1' as shown in FIG. 4B. The end E2 is closer to the left than the end E1, while the end E1' is higher than the end E2' as shown in FIG. 4C. The end E2 is closer to the left than the end E1, while the end E2' is higher than the end E1' as shown in FIG. 4D. The end E1 is closer to the left than the end E2, while the end E1' is closer to the right than the end E2' as shown in FIGS. 5A and 5B. The end E2 is closer to the left than the end E1, while the end E1' is closer to the right than the end E2' as shown in FIG. 5C. The end E2 is closer to the left than the end E1, while the end E2' is closer to the right than the end E1' as shown in FIG. 5D.

The ground plate G may be at the same level as the ends E1 and E2, while the ground plate G' may be at the same level as the ends E1' and E2'. In some embodiments, the ends E1, E2, E1' and E2', and ground plates G and G' are at same level as shown in FIGS. 4A to 4D and 5A to 5D, but not limited thereto. The ground plates G and G' are arranged outside the second segments S2 and S2' in the same row or the same column, respectively. The positions and shapes of the ground plates G and G' may be adjusted and changed according to the position of the die to which the 3D solenoid inductor to be coupled. The ground plate G is arranged at the left of the 3D solenoid inductor I-4, while the ground plate G' is arranged below the 3D solenoid inductor I-4' as shown in FIG. 4A. The ground plate G is arranged below the 3D solenoid inductor I-4, while the ground plate G' is arranged at the right of the 3D solenoid inductor I-4' as shown in FIGS. 4B and 4C. The ground plate G is arranged below the 3D solenoid inductor I-4, while the ground plate G' is arranged at the left of the 3D solenoid inductor I-4' as shown in FIG. 4D. The ground plates G and G' are arranged below the 3D solenoid inductor I-5 and I-5', respectively as shown in FIGS. 5A to 5C. The ground plate G is arranged below the 3D solenoid inductor I-5, while the ground plate G' is arranged over the 3D solenoid inductor I-5' as shown in FIG. 5D.

In some embodiments, the 3D solenoid inductors I-4 and I-4' are arranged orthogonally, and generate orthogonal magnetic fields M and M' as shown in FIGS. 4A to 4D. In alternative embodiments, 3D solenoid inductors I-5 and I-5' are arranged in parallel, and generate parallel magnetic fields M and M' as shown in FIGS. 5A to 5D. The directions of the parallel magnetic fields M and M' may be the same as shown in FIGS. 5A to 5C, or opposite as shown in FIG. 5D.

The 3D solenoid inductor of the present disclosure may be integrated with various packaging processes. In some embodiments, the 3D solenoid inductor may be formed from portions of two front-side RDLs, and TIVs, as shown in FIGS. 1A to 1G. In alternative embodiments, the 3D solenoid inductor may be formed from portions of a back-side RDL, TIVs, and a front-side RDL as shown in FIGS. 6A to 6E and 10A to 10G.

Figure 6A:
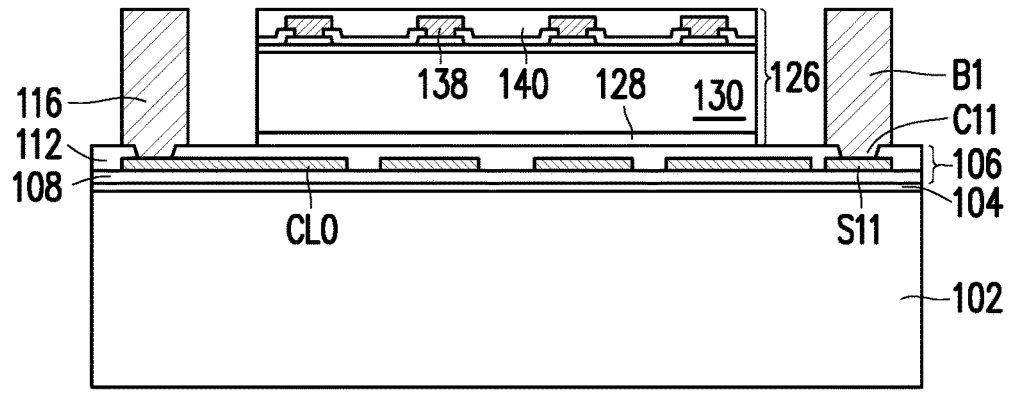
FIGS. 6A through 6E are schematic cross-sectional views illustrating a method of manufacturing a device package having a 3D solenoid inductor according to some embodiments of the disclosure.

Referring to FIG. 6A, a carrier substrate 102 is provided, and a release layer 104 is formed on the carrier substrate 102. In some embodiments where the integrated circuit die 126 have a large footprint, the space available for conductive pillars 116 in the package regions may be limited. Use of a back-side redistribution layer structure allows for an improved interconnect arrangement when the package regions have limited space available for the conductive pillars 116. Therefore, before conductive pillars 116 are formed, a back-side redistribution layer structure 106 is formed on the release layer 104.

The back-side redistribution layer structure 106 may include a bottom dielectric layer 108, a metallization pattern 110, and a top dielectric layer 112. The bottom dielectric layer 108 is formed on the release layer 104. The bottom surface of the bottom dielectric layer 108 may be in contact with the top surface of the release layer 104. In some embodiments, the bottom dielectric layer 108 is formed of a polymer, such as polybenzoxazole (PBO), polyimide, benzocyclobutene (BCB), or the like. In other embodiments, the dielectric layer 108 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 108 may be formed by any acceptable deposition process, such as spin coating, chemical vapor deposition (CVD), laminating, the like, or a combination thereof.

The metallization pattern 110 may also be referred to as redistribution layers or redistribution lines. The metallization pattern 110 is formed on the bottom dielectric layer 108. The metallization pattern 110 includes conductive lines CL0 and a first segment S11 of an 3D solenoid inductor I-11 shown in FIG. 6E. In some embodiments, the first segment S11 of the 3D solenoid inductor I-11 is not electrically connected to the die 126.

As an example to form the metallization pattern 110, a seed layer is formed over the bottom dielectric layer 108. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 110. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 110.

The top dielectric layer 112 is formed on the metallization pattern 110 and the bottom dielectric layer 110. In some embodiments, the top dielectric layer 112 is formed of a polymer, which may be a photo-sensitive material such as PBO, polyimide, BCB, or the like, that may be patterned using a lithography mask. In other embodiments, the top dielectric layer 112 is formed of a nitride such as silicon nitride; an oxide such as silicon oxide, PSG, BSG, BPSG; or the like. The top dielectric layer 112 may be formed by spin coating, lamination, CVD, the like, or a combination thereof. The top dielectric layer 112 is then patterned to form openings exposing portions of the metallization pattern 110. The patterning may be by an acceptable process, such as by exposing the top dielectric layer 112 to light when the dielectric layer 112 is a photo-sensitive material or by etching using, for example, an anisotropic etch.

It should be appreciated that the back-side redistribution layer structure 106 may include any number of dielectric layers and metallization patterns. Additional dielectric layers and metallization patterns may be formed by repeating the processes for forming the metallization pattern and dielectric layer. The metallization patterns may include conductive lines and conductive vias. The conductive vias may be formed during the formation of the metallization patterns by forming the seed layer and conductive material of the metallization patterns in the opening of the underlying dielectric layer. The conductive vias may therefore interconnect and electrically couple the various conductive lines.

Conductive pillars 116 are formed on and in the top dielectric layer 112 to be in contact with the metallization pattern 110. The conductive pillars 116 may be formed in a manner similar to the conductive pillars 216, and may be formed of the same material as the conductive pillars 216 as shown in FIG. 1C.

Dies 126 are adhered to the release layer 104 by an adhesive 128. The dies 126 may be integrated circuit (IC) dies such as logic dies (e.g., central processing unit, microcontroller, etc.), memory dies (e.g., dynamic random access memory (DRAM) die, static random access memory (SRAM) die, etc.), high bandwidth memory (HBM) dies, power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), integrated passive device (IPD) dies, application-specific integrated circuit (ASIC) dies, and serializer-deserializer (SerDes) dies, voltage regulator (VR) dies, quartz crystal resonator (XTAL) dies, low temperature co-fired ceramic (LTCC) dies, the like, or a combination thereof. The dies 126 may be semiconductor bridge dies such as silicon bridge dies. Also, in some embodiments, the dies 126 may be in different sizes (e.g., different heights and/or surface areas). In alternative embodiments, the dies 126 may be in the same size (e.g., same heights and/or surface areas).

Figure 6B:
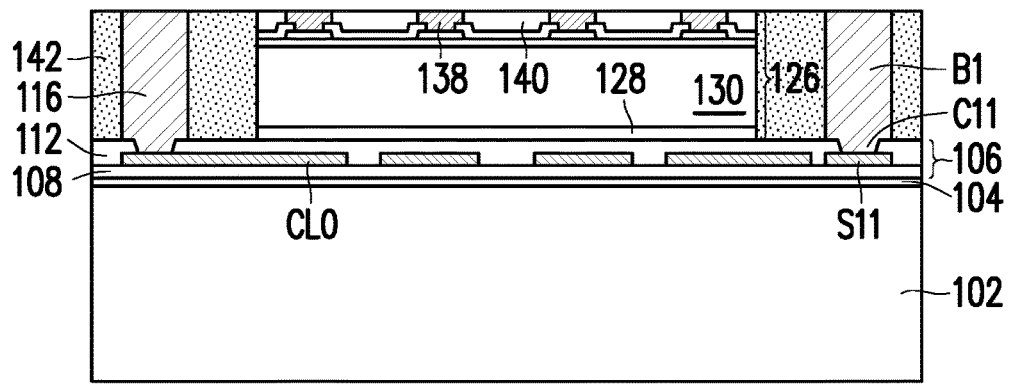

Referring to FIG. 6B, an encapsulant 142 is formed on the various components. The encapsulant 142 may be formed in a manner similar to the encapsulant 142 as shown in FIG. 1B, and may be formed of the same material as the encapsulant 142 as shown in FIG. 1B. After formation, the encapsulant 142 laterally encapsulates the conductive pillars 116 and the dies 126. After the encapsulant 142 is formed, a planarization process is then performed on the encapsulant 142 to remove a portion of the encapsulant 142, such that the top surfaces of the die connectors 138 are exposed. In some embodiments which the top surfaces of the front-side surfaces of the dies 126 are not coplanar, portions of the dielectric layer 140 and the conductive pillars 116 may also be removed by the planarization process. In some embodiments, top surfaces of the die connectors 138, the dielectric layer 140, the conductive pillars 116, and the encapsulant 142 are substantially coplanar after the planarization process. The planarization process may be, for example, a chemical-mechanical polish (CMP), a grinding process, or the like. In some embodiments, the planarization may be omitted, for example, if the die connectors 138 are already exposed. After the planarization process is performed, the conductive pillars 116 penetrate the encapsulant 142, and the conductive pillars 116 are sometimes referred to as through vias 116 or through integrated fan-out vias (TIVs) 116.

The through via 116 or the through integrated fan-out via (TIV) 116 which is in contact with the first segment S11 of the 3D solenoid inductor I-11 may be referred to as a connect portion C11 and a body B1 of a second segment S12 of the 3D solenoid inductor I-11 as shown in FIG. 5D. The connect portion C11 of the second segment S12 is in contact with the first segment S11 of the 3D solenoid inductor I-11. The sidewalls of the connect portion C11 may be straight or inclined. In some embodiments, the connect portion C11 has inclined sidewalls and is tapered toward the first segment S11 of the 3D solenoid inductor I-11. The body B1 is in contact with the connect portion C11, but there is no interface therebetween.

Figure 6C:
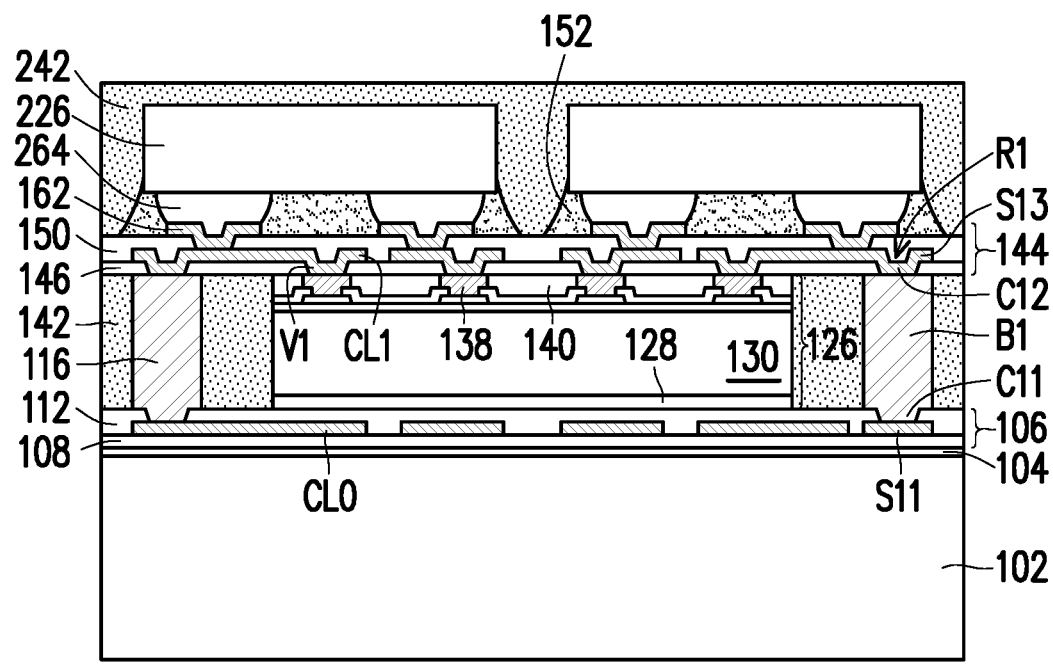

Referring to FIG. 6C, a front-side redistribution layer structure 144 is formed over front-side surfaces (or referred to as the active surfaces) of the dies 126, the through via 116, and the encapsulant 142. The front-side redistribution layer structure 144 includes dielectric layers 146, and 150, and metallization patterns 148. The metallization patterns 148 may also be referred to as redistribution layers or redistribution lines. The front-side redistribution layer structure 144 is shown as an example. More dielectric layers and metallization patterns may be formed in the front-side redistribution layer structure 144. If more dielectric layers and metallization patterns are to be formed, steps and processes discussed below may be repeated. The front-side redistribution layer structure 144 may be formed in a manner similar to the front-side redistribution layer structure 144 as shown in FIG. 1B, and may be formed of the same material as the front-side redistribution layer structure 144 as shown in FIG. 1B.

The metallization patterns 148 include conductive lines CL1 and conductive vias V1. The metallization patterns 148 further include a connect portion C12 of the second segment S12 and a third segment S13 of the 3D solenoid inductor I-11. In some embodiments, the third segment S13 may be electrically connected to the die 126 through the conductive lines CL1 and the conductive vias V1. In some embodiments, the conductive via V1, the conductive lines CL1, and the connect portion C12 of the second segment S12 have inclined sidewalls, and are tapered toward the dies 126 and the body B1 of the second segment S12. In addition, the metallization pattern 148 may be a conformal layer, and has recesses R1 on the conductive via V1 and the third segment S13, respectively.

UBMs 162 are optionally formed on and extending through the dielectric layer 150. The UBMs 162 may be formed in a manner similar to the UBMs 262, and may be formed of the same material as the UBMs 262 as shown in FIG. 1G.

Dies 226 are bonded to the front-side redistribution layer structure 144 through conductive connectors 264. In some embodiments, the dies 226 and the dies 126 are stacked in a face-to-face manner. In alternative embodiments, the die 226 has through silicon via (TSV) in a substrate of the die 226, and the dies 226 and 126 are stacked in a back-to-face manner. The dies 226 may be electrically connected to the dies 126 and/or the through vias 116. In some embodiments, the dies 226 may further be electrically connected to the third segment S13 of the 3D solenoid inductor I-11 through the conductive connectors 264, the UBMs 162, and the conductive lines CL1 of the front-side redistribution layer structure 144. In some embodiments, the conductive connectors 264 are formed on UBMs of the dies 226. The conductive connectors 264 may be formed of the same material as the conductive connectors 264 as shown in FIG. 1G.

Figure 6D:
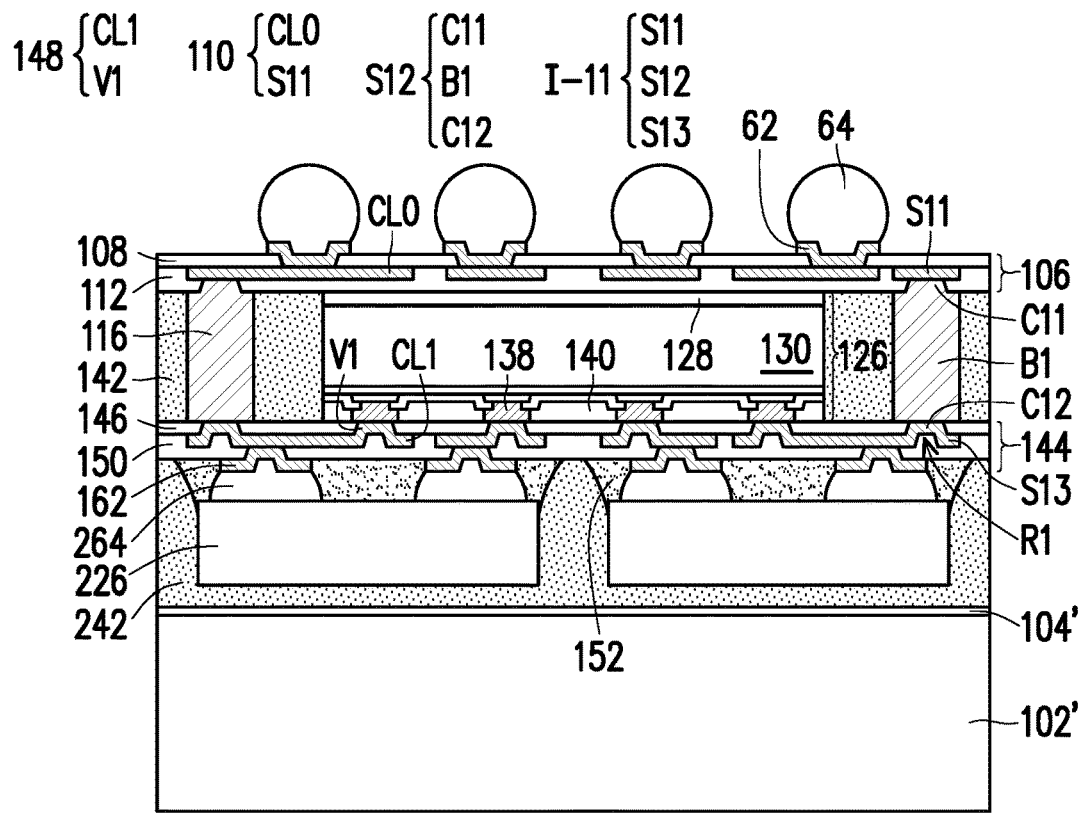

For simplicity, two dies 226 are shown, but not limited thereto. The dies 226 may be integrated circuit (IC) dies such as logic dies (e.g., central processing unit, microcontroller, etc.), memory dies (e.g., dynamic random access memory (DRAM) die, static random access memory (SRAM) die, etc.), high bandwidth memory (HBM) dies, power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), integrated passive device (IPD) dies, application-specific integrated circuit (ASIC) dies, and serializer-deserializer (SerDes) dies, voltage regulator (VR) dies, quartz crystal resonator (XTAL) dies, low temperature cofired ceramic (LTCC) dies, the like, or a combination thereof. Also, in some embodiments, the dies 226 may be in different sizes (e.g., different heights and/or surface areas). In alternative embodiments, the dies 226 may be in the same size (e.g., same heights and/or surface areas). In some embodiments, the die 226 may be offset from the die 126 as shown in FIG. 6D. In alternative embodiments. the integrated circuit dies 226 may be placed directly above the die 126 (not shown).

Referring to FIG. 6C, an encapsulant 242 is formed on the various components. After formation, the encapsulant 242 laterally encapsulates the dies 226, the conductive connectors 264, and the UBMs 162. The encapsulant 242 may further cover top surfaces of the dies 226 so that the dies 226 are buried or embedded in the encapsulant 242. The encapsulant 242 may be formed in a manner similar to the encapsulant 142, and may be formed of the same material as the encapsulant 242 as shown in FIG. 1E.

In some embodiments, an underfill material 152 is formed between the dies 226 and the front-side redistribution layer structure 144 before the encapsulant 242 is formed. The underfill material 152 may, for example, comprise a liquid epoxy that is dispensed in a gap between the dies 226 and the front-side redistribution layer structure 144, e.g., using a dispensing needle or other suitable dispensing tool, and then cured to harden. The underfill material 152 fills the gap between the dies 226 and the front-side redistribution layer structure 144, and may also fill gaps between sidewalls of the conductive connectors 264 and between the UBMs 162. The subsequently formed encapsulant 242 is laterally separated from the conductive connectors 264 by the underfill material 152. In other embodiments, the underfill material 152 is omitted, in which case a subsequently formed encapsulant 242 may fill the gaps between the dies 226 and the front-side redistribution layer structure 144, between the conductive connectors 164, and between the UBMs 162.

Referring to FIG. 6D, after the encapsulant 242 is formed, another temporary carrier substrate 102' is optionally attached to the encapsulant 242 opposite to the carrier substrate 102. A release layer 104' may be formed between the carrier substrate 102' and the encapsulant 242. A carrier substrate de-bonding is performed to detach (or "de-bond") the carrier substrate 102 from the encapsulant 242.

Referring to FIG. 6D, UBMs 62 are optionally formed on and extending through the bottom dielectric layer 108. The UBMs 62 may be formed in a manner similar to the UBMs 262, and may be formed of the same material as the UBMs 262 as shown in FIG. 1G. Conductive connectors 64 are formed on the UBMs 62 to form a component. The conductive connectors 64 may be formed in a manner similar to the conductive connectors 264, and may be formed of the same material as the conductive connectors 264 as shown in FIG. 1G.

Figure 6E:
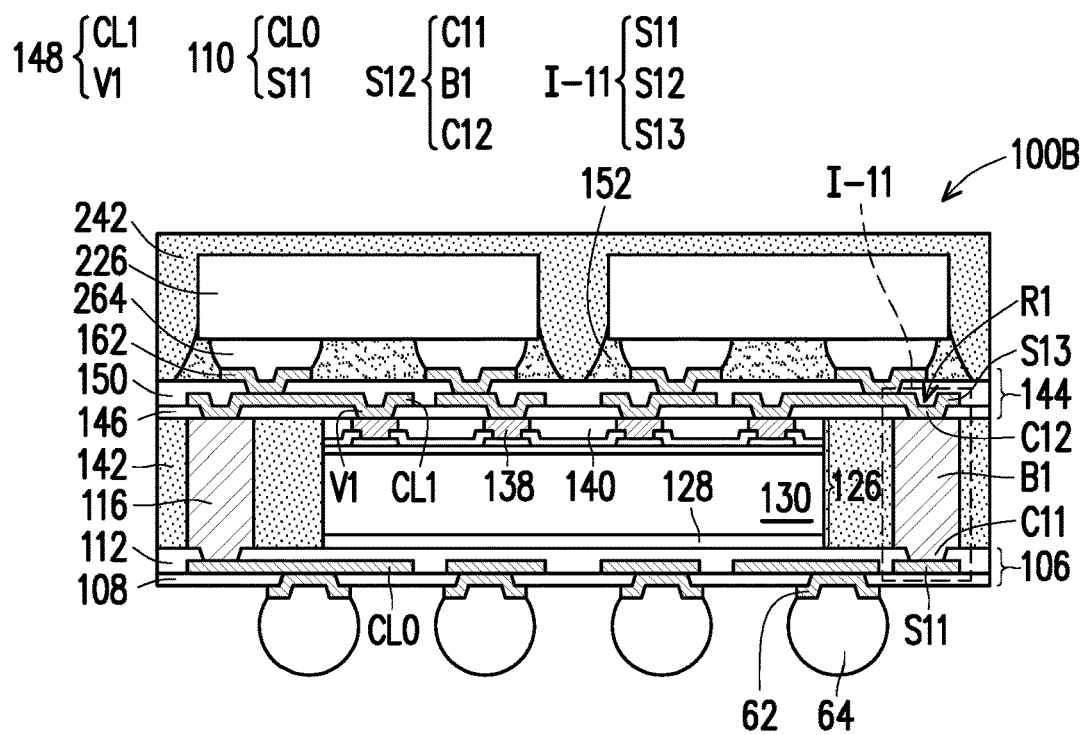

Referring to FIG. 6E, the component is then flipped over and placed on a tape (not shown). A carrier substrate de-bonding is performed to detach (or "de-bond") the carrier substrate 102' from the encapsulant 242. Thereafter, the component is singulated to form device packages 100B. The singulation may be by sawing, dicing, or the like.

Referring to FIGS. 7A to 7E, a device package 100C-1 is similar to the device package 100B, and may be formed in a manner similar to the device package 100B. The device package 100C-1 includes dies 126 and 226. The dies 126 includes dies 126a, 126b, 126c, 126d, and 126e, while the dies 226 include dies 226a, 226b, and 226c. In some embodiments, the dies 126a, 126b, 126e, 126d and 126e are a semiconductor bridge die, an integrated passive device (IPD) die, a SRAM die, a VR die, and an analog die, while the dies 226a, 226b, and 226c are a HBM die, an application-specific integrated circuit (ASIC) die, and a serializer-deserializer (SerDes) die, respectively.

Figure 7C:
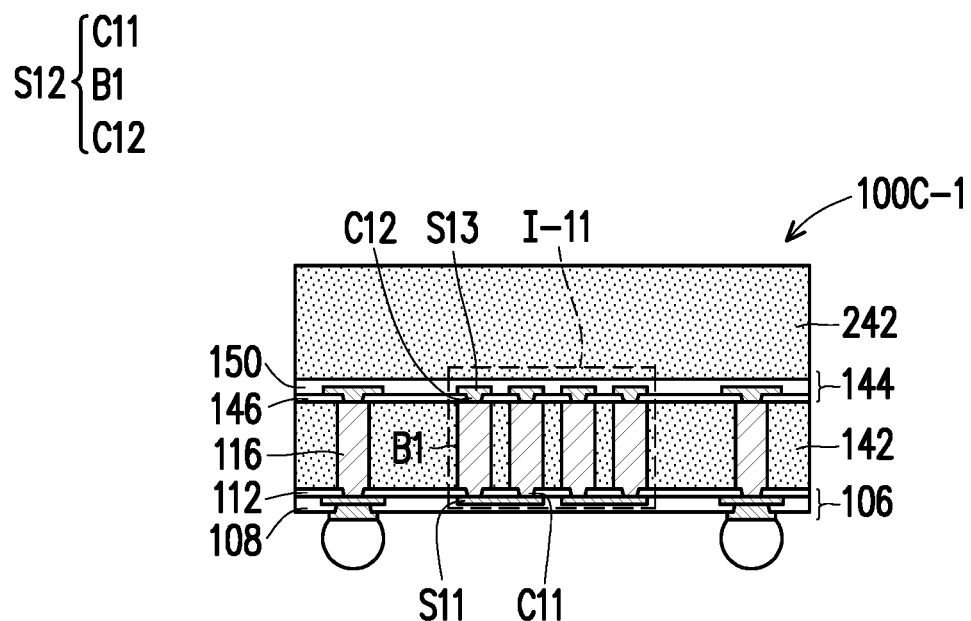
FIG. 7C is a schematic cross-sectional view taken along line B-B' of FIG. 7A.

Referring to FIGS. 7A and 7C, in some embodiments, the device package 100C-1 further includes one 3D solenoid inductor I-11. The 3D solenoid inductor I-11 is formed laterally between the die 126c and 126d. The 3D solenoid inductor I-11 is portions of the front-side redistribution layer structure 144, the TIVs 116, and the back-side redistribution layer structure 106, and embedded in the dielectric layers 150 and 146, the encapsulant 142, and the dielectric layers 112 and 108.

Referring to FIGS. 7A and 7C, the 3D solenoid inductor I-11 includes a plurality of first segments S11, a plurality of second segments S12, and a plurality of third segments S13. One end E1 of the 3D solenoid inductor I-11 is electrically connected to the die 126c through the metallization patterns 148 of the front-side redistribution layer structure 144. The other end E2 of the 3D solenoid inductor I-11 may be electrically connected to the die 126d through the metallization patterns 148 of the front-side redistribution layer structure 144.

Referring to FIGS. 7C and 7D, in some embodiments, the first segments S11 and the third segments S13 of the 3D solenoid inductor I-11 are surrounded by the dielectric layers 108 and 112 and the dielectric layers 146 and 150. The connect portions C11 of the second segment S12 are surrounded by the dielectric layers 108 and 112. The sidewalls of the bodies B1 of the second segments S12 are surrounded by the encapsulant 142. The connect portions C12 of the second segment S12 are surrounded by the dielectric layers 146 and 150.

In the above embodiments, the device package 100C-1 includes the 3D solenoid inductor I-11, and the 3D solenoid inductor I-11 surrounds portions of the encapsulant 142, and the dielectric layers 108, 112, 146 and 150 as shown in FIGS. 7C and 7D. In alternative embodiments, a device package 100C-2 includes a 3D solenoid inductor I-11', and the 3D solenoid inductor I-11' surrounds a magnetic material. In other words, device package 100C-2 includes the 3D solenoid inductor I-11' with a magnetic core MC.

Referring to FIGS. 8A to 8D, the 3D solenoid inductor I-11' is similar to the 3D solenoid inductor I-11, and the difference is that the 3D solenoid inductor I-11' further include the magnetic core MC. The magnetic core MC includes metal such as iron (Fe), cobalt (Co) and nickel (Ni) and alloy thereof. The magnetic core MC is placed inside the 3D solenoid inductor I-11' so as to increase magnetic flux. The magnetic core MC may be placed on the back-side redistribution layer structure 106 after the conductive pillars 116 are formed and before the encapsulant 142 is formed. In some embodiments, the first segments S11 and the third segments S13 are formed on a bottom surface and a top surface of the magnetic core MC, respectively. The bodies B1 of second segments S12 are laterally surrounded the magnetic core MC. The sidewalls of the magnetic core MC are laterally encapsulated by the encapsulant 142. The bottom surface and the top surface of the magnetic core MC may be covered by the dielectric layers 112 and 146.

Figure 8A:
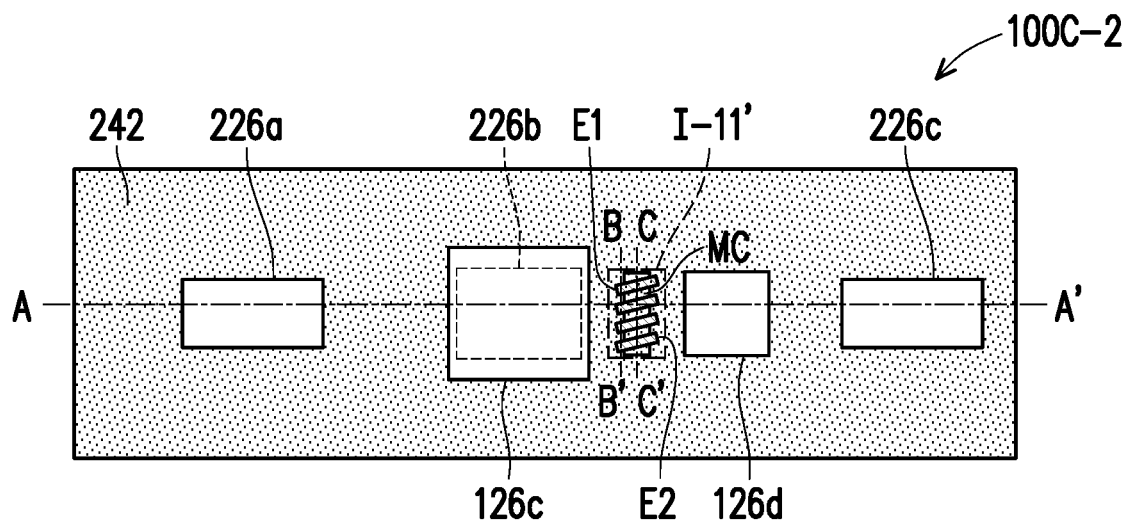
FIG. 8A is a top view illustrating a device package having a 3D solenoid inductor with a magnetic core according to some embodiments of the disclosure.
Figure 8B:
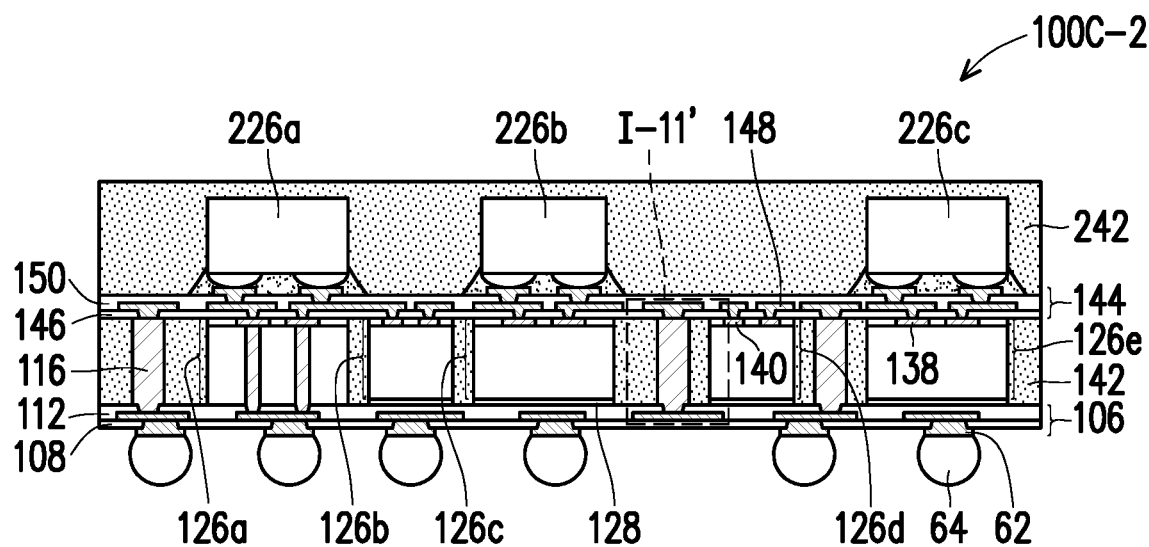
FIG. 8B is a schematic cross-sectional view taken along line A-A' of FIG. 8A.
Figure 8C:
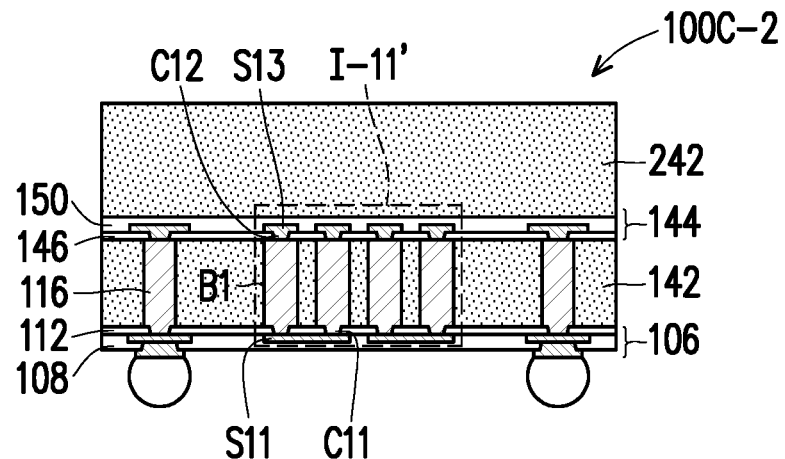
FIG. 8C is a schematic cross-sectional view taken along line B-B' of FIG. 8A.

In the above embodiments, the device package 100C-1 or 100C-2 includes one 3D solenoid inductor I-11 or I-11' between one side of the die 126d (as shown in FIGS. 7A and 8A). In alternative embodiments, a device package 100C-3 includes a plurality of 3D solenoid inductors on a plurality of sides of one die 126d (as shown in FIG. 9A).

Referring to FIG. 9, in some embodiments, a device package 100C-3 includes three 3D solenoid inductors I-12, I-13 and I-14. The 3D solenoid inductors I-12, I-13, and I-14 may be placed on three sides of the die 126d, but not limited thereto. The 3D solenoid inductors may be placed on the same side of the die 126d. The 3D solenoid inductors I-12, I-13 and I-14 may be electrically connected to the same two dies or different two dies. In some embodiments, the 3D solenoid inductors I-12, I-13 and I-14 are electrically connected to the dies 126d and 226b, respectively. The 3D solenoid inductors I-12, I-13, and I-14 may have the same structure, or different structures. The structures of the 3D solenoid inductors I-12, I-13, and I-14 may be the same as the structure of the 3D solenoid inductor I-11 or I-11'.

Figure 10A:
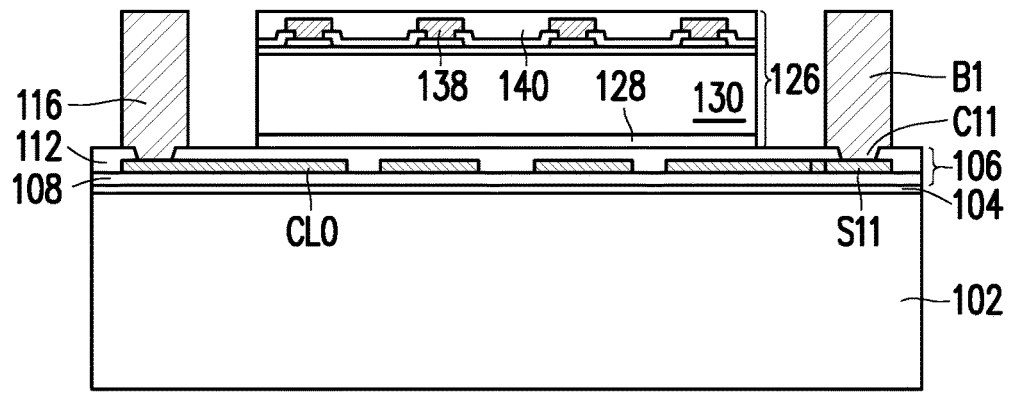
FIGS. 10A through 10G are schematic cross-sectional views illustrating a method of manufacturing a device package having a 3D solenoid inductor according to some embodiments of the disclosure.
Figure 10B:
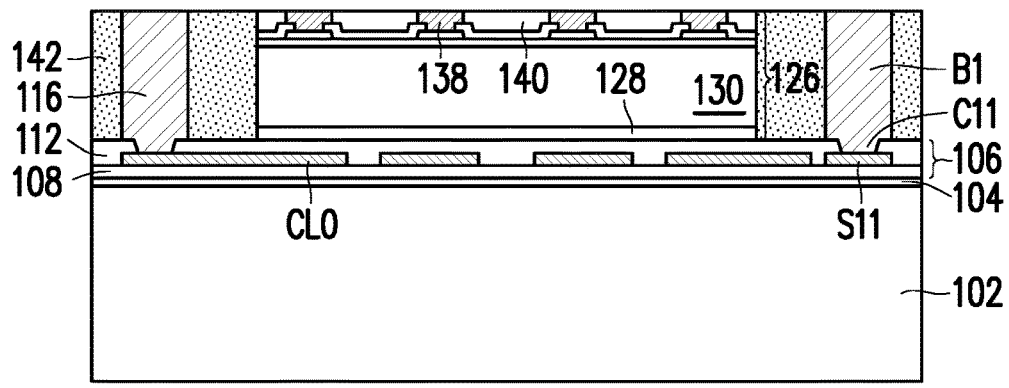
Figure 10C:
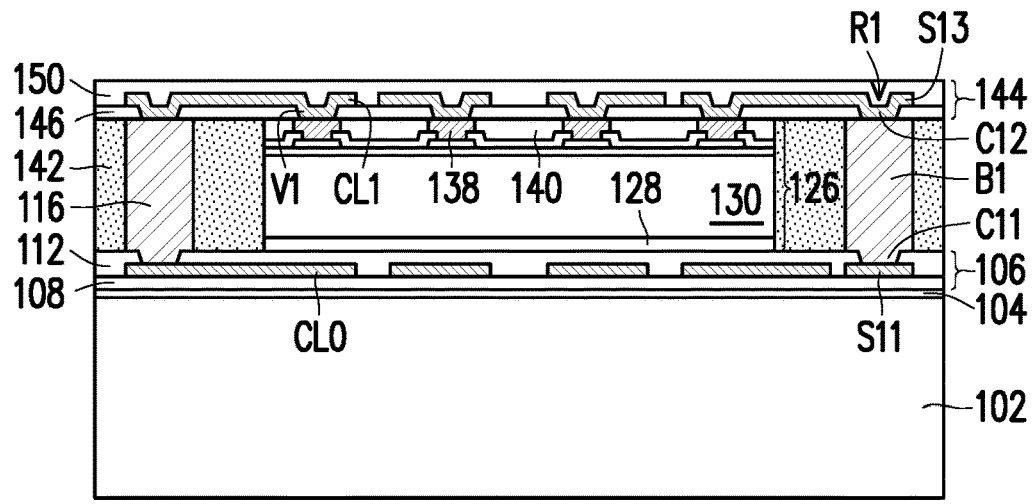

Referring to FIGS. 10A to 10C, a back-side redistribution layer structure 106 is formed on release layer 104 over a carrier substrate 102, and through vias 116, dies 126, an encapsulant 142 are formed on the back-side redistribution layer structure 106, and a front-side redistribution layer structure 144 are formed on the die 126, encapsulant 142, and the through vias 116 in a manner similar to the corresponding parts shown in FIGS. 6A and 6C.

Figure 10D:
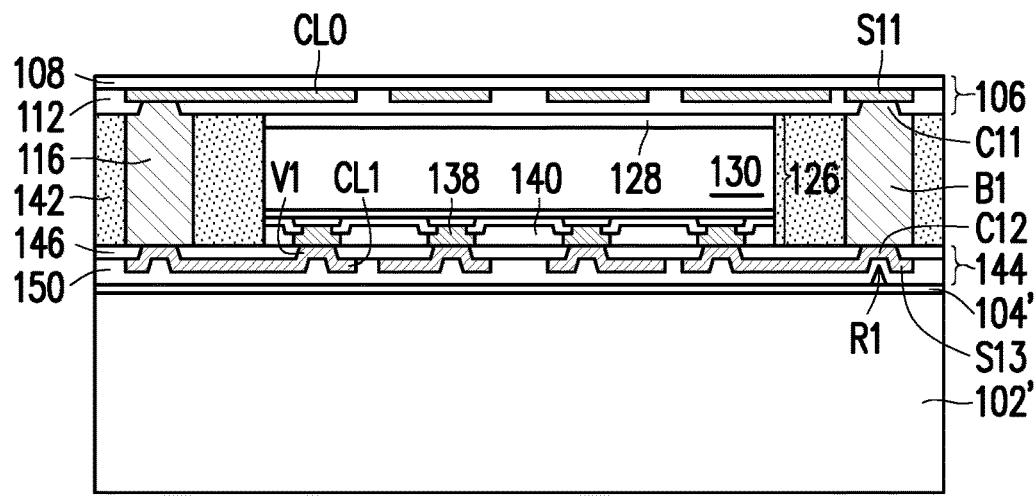

Referring to FIG. 10D, after the front-side redistribution layer structure 144 is formed, another temporary carrier substrate 102' is optionally attached to the front-side redistribution layer structure 144 opposite to the carrier substrate 102. A release layer 104' may be formed between the carrier substrate 102' and the back-side redistribution layer structure 106. A carrier substrate de-bonding is performed to detach (or "de-bond") the carrier substrate 102 from the back-side redistribution layer structure 106, e.g., the dielectric layer 108.

Figure 10E:
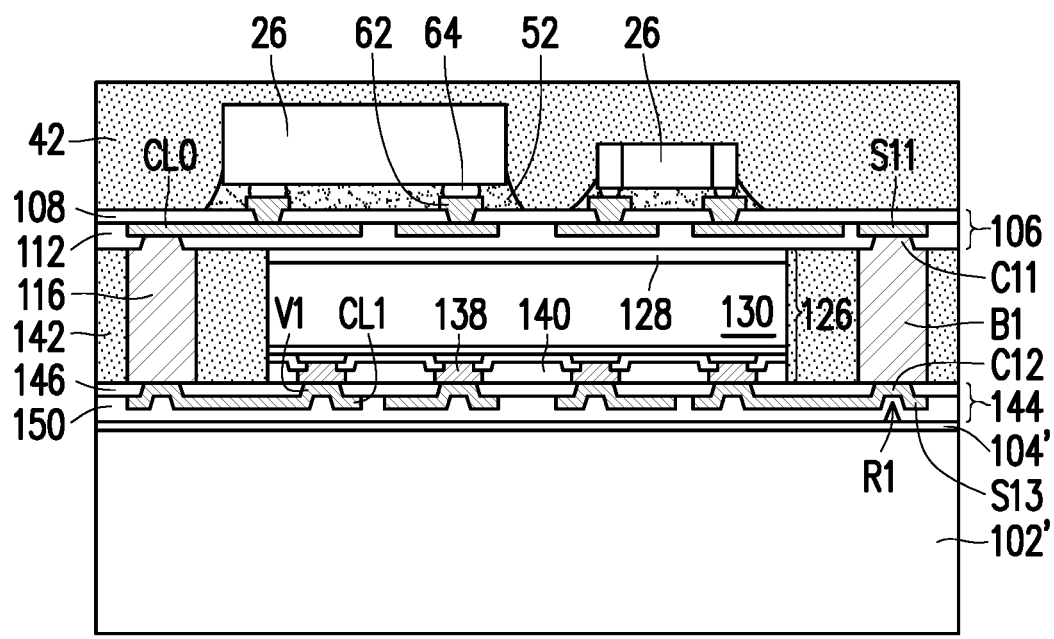

Referring to FIG. 10E, UBMs 62 are optionally formed on and extending through the bottom dielectric layer 108. The UBMs 62 may be formed in a manner similar to the UBMs 262, and may be formed of the same material as the UBMs 262 as shown in FIG. 1G. Dies 26 are bonded to the back-side redistribution layer structure 106 through conductive connectors 64. In some embodiments, the dies 26 and the dies 126 are stacked in a face-to-back manner. In alternative embodiments, the die 26 has through silicon via (TSV) in a substrate of the die 26, and the dies 26 and 126 are stacked in a back-to-back manner. The dies 26 may be electrically connected to the dies 126 and/or the through vias 116. The dies 26 may be electrically connected to the first segment S11 of a 3D solenoid inductor I-21 through the conductive connectors 64, the UBMs 62, and the conductive lines CL0 of the back-side redistribution layer structure 106. In some embodiments, the conductive connectors 64 are formed on UBMs of the dies 26. The conductive connectors 64 may be formed of the same material as the conductive connectors 264 as shown in FIG. 1G.

For simplicity, two dies 26 are shown, but not limited thereto. In some embodiments, the dies 26 are integrated circuit dies, and may be integrated circuit (IC) dies such as logic dies (e.g., central processing unit, microcontroller, etc.), memory dies (e.g., dynamic random access memory (DRAM) die, static random access memory (SRAM) die, etc.), high bandwidth memory (HBM) dies, power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), integrated passive device (IPD) dies, application-specific integrated circuit (ASIC) dies, and serializer-deserializer (SerDes) dies, voltage regulator (VR) dies, quartz crystal resonator (XTAL) dies, low temperature cofired ceramic (LTCC) dies the like, or a combination thereof. Also, in some embodiments, the dies 26 may be in different sizes (e.g., different heights and/or surface areas) as shown in FIG. 10E. In alternative embodiments, the dies 26 may be in the same size (e.g., same heights and/or surface areas). In some embodiments, one of the dies 26 (such as the left dies 26 shown in FIG. 10E) may be offset from the die 126. In alternative embodiments, another one of the dies 26 (such as the right dies 26 shown in FIG. 6D) may be placed directly above the die 126.

An encapsulant 42 is formed on the various components. After formation, the encapsulant 42 laterally encapsulates the integrated circuit dies 26, the conductive connectors 64, and the UBMs 62. The encapsulant 42 may further cover top surfaces of the dies 26 so that the dies 26 are buried or embedded in the encapsulant 42. The encapsulant 42 may be formed in a manner similar to the encapsulant 142, and may be formed of the same material as the encapsulant 142 as shown in FIG. 1B.

In some embodiments, an underfill material 52 is formed between the dies 26 and the back-side redistribution layer structure 106 before the encapsulant 42 is formed. The underfill material 52 may be formed in a manner similar to the underfill material 152, and may be formed of the same material as the underfill material 152 as shown in FIG. 6C.

Figure 10F:
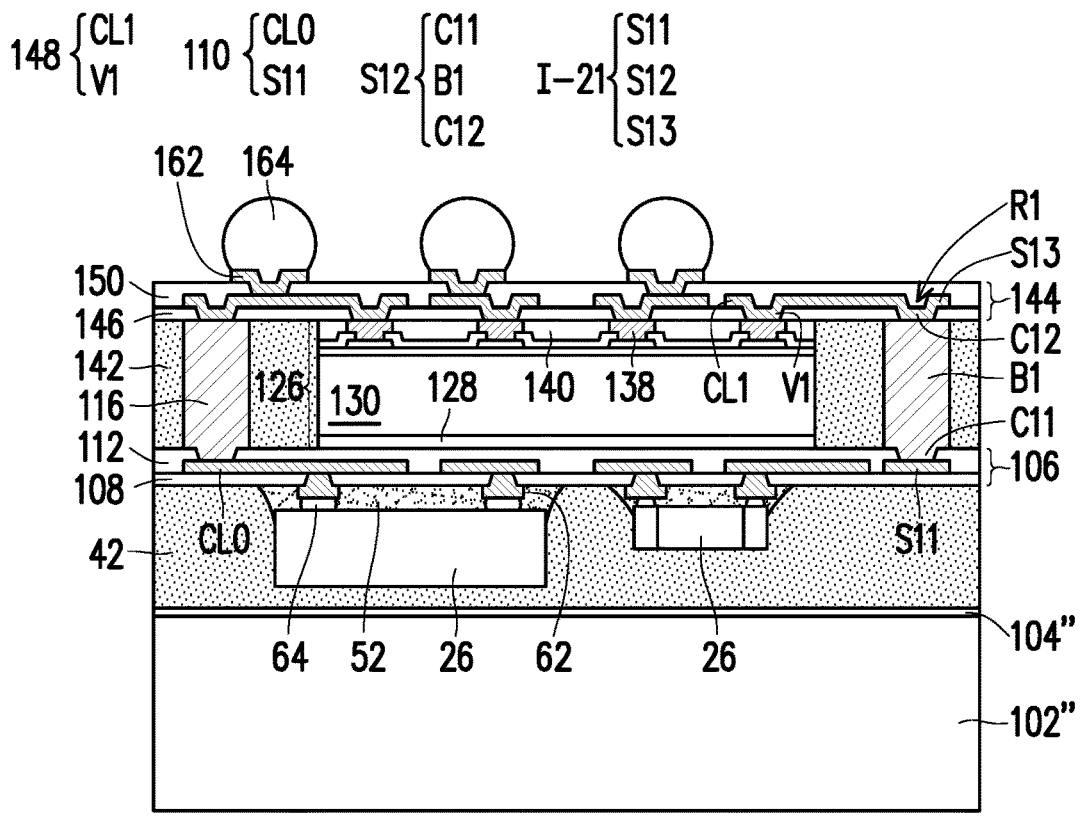

Referring to FIG. 10F, after the encapsulant 42 is formed, another temporary carrier substrate 102" is optionally attached to the encapsulant 42 opposite to the carrier substrate 102'. A release layer 104" may be formed between the carrier substrate 102" and the encapsulant 42. A carrier substrate de-bonding is performed to detach (or "de-bond") the carrier substrate 102' from the encapsulant 42.

Referring to FIG. 10F, UBMs 162 are optionally formed on and extending through the dielectric layer 150. The UBMs 162 may be formed in a manner similar to the UBMs 262, and may be formed of the same material as the UBMs 262 as shown in FIG. 1G. Conductive connectors 164 are formed on the UBMs 162 to form a component. The conductive connectors 164 may be formed in a manner similar to the conductive connectors 264, and may be formed of the same material as the conductive connectors 264 as shown in FIG. 1G.

Figure 10G:
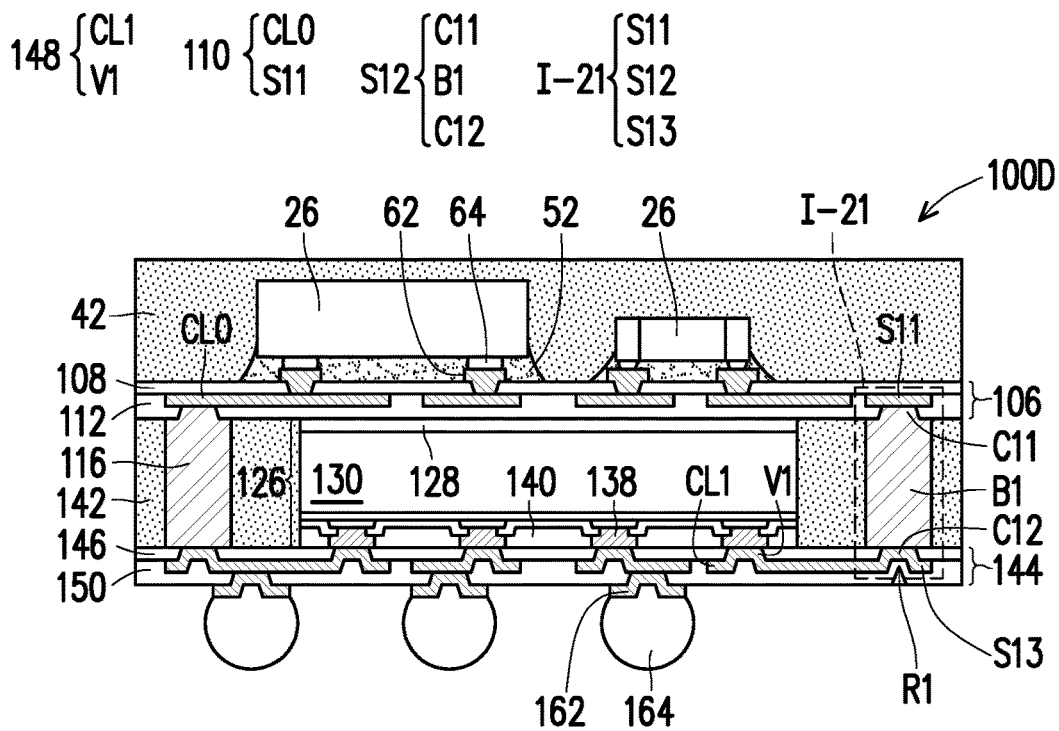

Referring to FIG. 10G, the component is then flipped over and placed on a tape (not shown). A carrier substrate de-bonding is performed to detach (or "de-bond") the carrier substrate 102" from the encapsulant 42. Thereafter, the component is singulated to form device packages 100D. The singulation may be by sawing, dicing, or the like.

The device package 100D includes a 3D solenoid inductor I-21. The structure of the 3D solenoid inductor I-21 is similar to the structure of the 3D solenoid inductor I-11, and may be formed in a manner similar to the 3D solenoid inductor I-11. The 3D solenoid inductor I-21 may also be connected to the die 126 through the front-side redistribution layer structure 144.

Figure 11A:
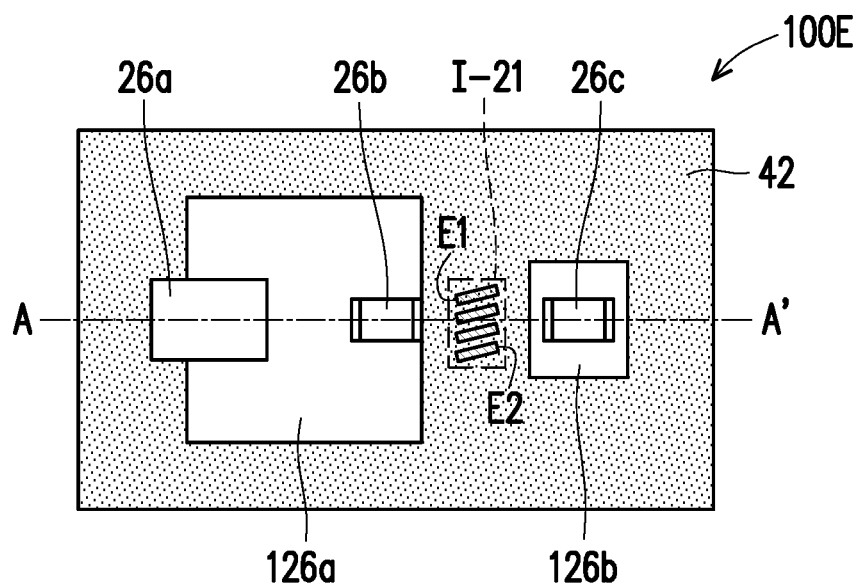
FIG. 11A is a top view illustrating a device package having a 3D solenoid inductor according to some embodiments of the disclosure.
Figure 11B:
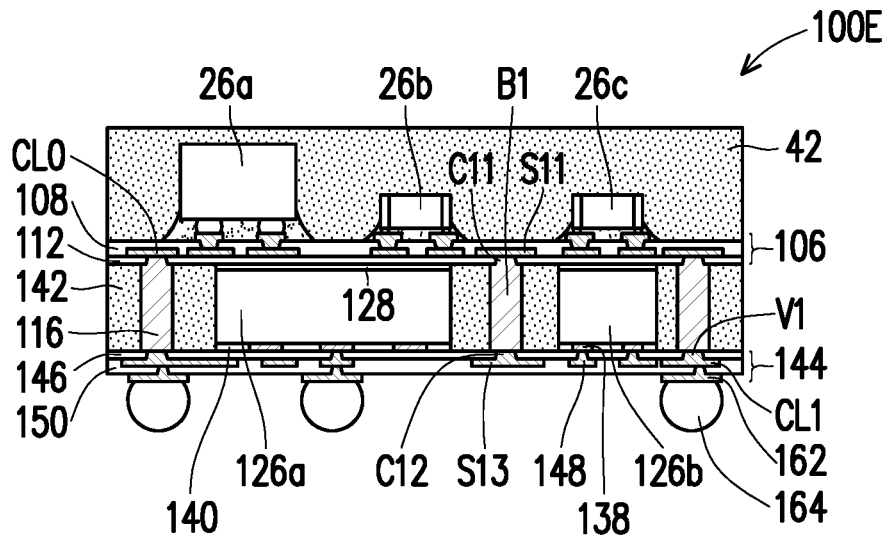
FIG. 11B is a schematic cross-sectional view taken along line A-A' of FIG. 11A.

Referring to FIGS. 11A and 11B, a device package 100E is similar to the device package 100D, and may be formed in a manner similar to the device package 100D. The device package 100E includes dies 26 and 126. The dies 26 includes dies 26a, 26b, and 26c, while the dies 126 include dies 126a, and 126b. In some embodiments, the dies 26a, 26b, and 26c are a quartz crystal resonator (XTAL) die, a first low temperature co-fired ceramic (LTCC) die, and a second LTCC die, while the dies 126a, and 126b are a RF die, and a VR die, respectively.

Referring to FIGS. 11A and 11B, in some embodiments, the device package 100E further includes one 3D solenoid inductor I-21. The 3D solenoid inductor I-21 is formed laterally between the die 126a and 126b. The 3D solenoid inductor I-21 is portions of the front-side redistribution layer structure 144, the TIVs 116, and the back-side redistribution layer structure 106, and embedded in the dielectric layers 150 and 146, the encapsulant 142, and the dielectric layers 112 and 108.

The 3D solenoid inductor I-12 includes a plurality of first segments S11, a plurality of second segments S12, and a plurality of third segments S13. One end E1 of the 3D solenoid inductor I-12 is electrically connected to the die 126a through the metallization patterns 148 of the front-side redistribution layer structure 144. The other end E2 of the 3D solenoid inductor I-11 may be electrically connected to the die 126b through the metallization patterns 148 of the front-side redistribution layer structure 144.

The first segments S11 and the third segments S13 of the 3D solenoid inductor I-21 are surrounded by the dielectric layers 108 and 112 and the dielectric layers 146 and 150. The connect portions C11 of the second segment S12 are surrounded by the dielectric layers 108 and 112. The sidewalls of the bodies B1 of the second segments S12 are surrounded by the encapsulant 142. The connect portions C12 of the second segment S12 are surrounded by the dielectric layers 146 and 150.

In the embodiment of the present disclosure, a 3D solenoid inductor is formed in an encapsulant. Since the encapsulant has low dielectric loss tangent, the 3D solenoid inductor with high Q factor may be provided.

In accordance with some embodiments of the disclosure, a package structure comprises a first die; a plurality of through vias, aside the first die; a first encapsulant laterally encapsulating the first die and the plurality of through vias; a first redistribution layer (RDL) structure on first sides of the first die, plurality of through vias, and the first encapsulant; a second RDL structure on second sides of the first die, the plurality of through vias, and the first encapsulant; and a plurality of conductive connectors, electrically connected to the second RDL structure. Portions of the first RDL structure, the plurality of through vias, and the second RDL structure are electrically connected to each other and form a solenoid inductor laterally aside the first die.

In accordance with some embodiments of the disclosure, a package structure comprises a die; a plurality of through vias, aside the die; an encapsulant laterally encapsulating the die and the plurality of through vias; a first redistribution layer (RDL) structure on first sides of the die, the plurality of through vias, and the encapsulant; and a second RDL structure on second sides of the die, the plurality of through vias, and the encapsulant. Portions of the first RDL structure, the plurality of through vias, and the second RDL structure are electrically connected to each other and form a first solenoid inductor and a second solenoid inductor laterally aside the first die.

In accordance with some embodiments of the disclosure, a method of fabricating a package structure, comprises: forming a plurality of through vias; attaching a first die, so that the plurality of through vias is laterally aside the first die; forming a first encapsulant laterally encapsulating the first die and the plurality of through vias; forming a first redistribution layer (RDL) structure; forming a second RDL structure, wherein the first RDL structure is disposed on first sides of the first die, the plurality of through vias, and the first encapsulant; and the second RDL structure is disposed on second sides of the first die, the plurality of through vias, and the first encapsulant. Portions of the first RDL structure, the plurality of through vias, and the second RDL structure are electrically connected to each other and form a solenoid inductor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a first die;
   a plurality of through vias, aside the first die;
   a first encapsulant laterally encapsulating the first die and the plurality of through vias;
   a first redistribution layer (RDL) structure on a first sides of the first die, the plurality of through vias, and the first encapsulant;
   a second RDL structure on a second sides of the first die, the plurality of through vias, and the first encapsulant, wherein portions of the first RDL structure, the plurality of through vias, and the second RDL structure are electrically connected to each other and form a solenoid inductor laterally aside the first die, and a first end of the solenoid inductor is connected to a ground, and a second end of the solenoid inductor is connected to the first die, and the first end is level with the second end;
   a second die placed on the first side of the first die; and
   a second encapsulant laterally encapsulating the second die.

2. The package structure of claim 1, wherein the solenoid inductor is electrically connected to the first die through the second RDL structure.

3. The package structure of claim 1, wherein the solenoid inductor is electrically connected to the first die through the first RDL structure.

4. The package structure of claim 1, wherein the solenoid inductor is electrically connected to the second die through the first RDL structure.

5. The package structure of claim 1, further comprising a magnetic material surrounded by the solenoid inductor and laterally encapsulated by the first encapsulant.

6. The package structure of claim 1, further comprising a third die laterally aside the first die, and encapsulated by the first encapsulant, wherein the solenoid inductor is arranged between the first die and the third die.

7. The package structure of claim 6, wherein the solenoid inductor is electrically connected to the first die and the third die through the first RDL structure.

8. The package structure of claim 6, wherein the solenoid inductor is electrically connected to the first die and the third die through the second RDL structure.

9. A package structure, comprising:
   a first die;
   a plurality of through vias, aside the first die;
   a first encapsulant laterally encapsulating the first die and the plurality of through vias;
   a first redistribution layer (RDL) structure on a first sides of the first die, the plurality of through vias, and the first encapsulant;
   a second RDL structure on a second sides of the first die, the plurality of through vias, and the first encapsulant;

a second die placed on the first side of the first die; and a second encapsulant laterally encapsulating the second die, wherein sidewalls of the second encapsulant are flush with sidewalls of the first RDL structure, sidewalls of the first encapsulant, and sidewalls of the second RDL structure;

wherein portions of the first RDL structure, the plurality of through vias, and the second RDL structure are electrically connected to each other and form a first solenoid inductor and a second solenoid inductor laterally aside the first die, wherein a first end of the first solenoid inductor is coupled to a ground plate, and a second end of the first solenoid inductor is coupled to the first die, and the first end is level with the second end.

10. The package structure of claim 9, wherein the first solenoid inductor and the second solenoid inductor have a parallel arrangement.

11. The package structure of claim 9, wherein the first solenoid inductor and the second solenoid inductor having an orthogonal arrangement.

12. The package structure of claim 9, wherein the first solenoid inductor and the second solenoid inductor are arranged on a same side of the first die.

13. The package structure of claim 9, wherein the first solenoid inductor and the second solenoid inductor are arranged on different sides of the first die.

14. The package structure of claim 9, wherein the first solenoid inductor and the second solenoid inductor are electrically connected to the first die through the second RDL structure or the first RDL structure.

15. The package structure of claim 9, wherein the first end and the second end of the first solenoid inductor and the ground plate are disposed at a same level height.

16. The package structure of claim 9, further comprising:

a plurality of conductive connectors, electrically connected to the second RDL structure.

17. A method of fabricating a package structure, comprising:

forming a plurality of through vias;

attaching a first die, so that the plurality of through vias is laterally aside the first die;

forming a first encapsulant laterally encapsulating the first die and the plurality of through vias;

forming a first redistribution layer (RDL) structure;

forming a second RDL structure, wherein the first RDL structure is disposed on a first sides of the first die, the plurality of through vias, and the first encapsulant, and the second RDL structure is disposed on a second sides of the first die, the plurality of through vias, and the first encapsulant, wherein portions of the first RDL structure, the plurality of through vias, and the second RDL structure are electrically connected to each other and form a solenoid inductor, wherein a first end of the solenoid inductor is connected to a ground, and a second end of the solenoid inductor is connected to the first die, and the first end is level with the second end;

attaching a second die, so that the first RDL structure is electrically connected thereto;

forming a second encapsulant laterally encapsulating the second die; and singulating the first encapsulant, the first RDL structure, the second encapsulant, and the second RDL structure to form a plurality of device packages.

18. The method of claim 17, wherein the forming the first redistribution layer (RDL) structure is performed before the forming the plurality of through vias, the attaching the first die, and the forming the second RDL structure.

19. The method of claim 17, further comprising forming a plurality of conductive connectors to electrically connected to the second RDL structure after the forming second RDL structure.

20. The method of claim 17, wherein the forming the second RDL structure is performed before the forming the plurality of through vias, the attaching the first die, and the forming the first RDL structure.

\* \* \* \* \*